US012633903B2

(12) United States Patent
Yamaguchi et al.

(10) Patent No.: US 12,633,903 B2
(45) Date of Patent: May 19, 2026

(54) TRACKER MODULE, RADIO FREQUENCY SYSTEM, AND COMMUNICATION DEVICE

(71) Applicant: Murata Manufacturing Co., Ltd., Nagaokakyo (JP)

(72) Inventors: Kouji Yamaguchi, Nagaokakyo (JP); Sho Okamoto, Nagaokakyo (JP); Muneharu Kato, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 144 days.

(21) Appl. No.: 18/602,414

(22) Filed: Mar. 12, 2024

(65) Prior Publication Data

US 2024/0313744 A1 Sep. 19, 2024

(30) Foreign Application Priority Data

Mar. 14, 2023 (JP) ................................. 2023-040164

(51) Int. Cl.
H03H 19/00 (2006.01)
H03H 7/01 (2006.01)
H03H 1/00 (2006.01)

(52) U.S. Cl.
CPC ........ H03H 19/004 (2013.01); H03H 7/0115 (2013.01); *H03H 2001/0085* (2013.01)

(58) Field of Classification Search
CPC ............... H03H 7/0115; H03H 19/004; H03H 2001/0085
See application file for complete search history.

(56) References Cited

U.S. PATENT DOCUMENTS

| | | | | |
|---|---|---|---|---|
| 7,705,681 B2 * | 4/2010 | Ilkov | ......................... | H03F 1/22 |
| | | | | 330/124 R |
| 8,829,993 B2 | 9/2014 | Briffa et al. | | |
| 9,537,456 B2 * | 1/2017 | Briffa | ....................... | H03F 3/245 |
| 9,755,672 B2 * | 9/2017 | Perreault | ............... | H02M 3/158 |
| 2014/0354378 A1 * | 12/2014 | Zuo | ..................... | H03H 7/0115 |
| | | | | 29/25.03 |
| 2020/0382152 A1 * | 12/2020 | Tsukamoto | ............ | H03H 7/461 |
| 2021/0194452 A1 * | 6/2021 | Tsukamoto | ............... | H03H 1/56 |
| 2021/0288614 A1 * | 9/2021 | Hoversten | ................ | H03F 1/32 |

* cited by examiner

*Primary Examiner* — Quan Tra

(74) *Attorney, Agent, or Firm* — ArentFox Schiff LLP

(57) ABSTRACT

A tracker module is provided that includes a module laminate, an IC chip disposed at the module laminate, and a filter circuit including a plurality of inductors. The IC chip includes at least one switch included in a switched-capacitor circuit and at least one switch included in a supply modulator. The plurality of inductors include a first inductor and a second inductor that are disposed at the module laminate. The first inductor and the second inductor are adjacent to each other. A magnetic flux direction of the first inductor and a magnetic flux direction of the second inductor are perpendicular to each other.

18 Claims, 15 Drawing Sheets

VOLTAGE

ONE FRAME

Vcc

RADIO
FREQUENCY
SIGNAL

TIME

VOLTAGE

Vcc

RADIO
FREQUENCY
SIGNAL

TIME

TRACKER MODULE, RADIO FREQUENCY SYSTEM, AND COMMUNICATION DEVICE

CROSS REFERENCE TO RELATED APPLICATIONS

This application claims priority to Japanese Patent Application No. 2023-040164, filed Mar. 14, 2023, the entire content of which is hereby incorporated by reference in its entirety.

TECHNICAL FIELD

The present disclosure relates to a tracker module, a radio frequency system, and a communication device, and more specifically, to a tracker module including a filter circuit, a radio frequency system including the tracker module, and a communication device including the radio frequency system.

U.S. Pat. No. 8,829,993 discloses a power supply modulation circuit capable of supplying, to a power amplifier, a power supply voltage that is dynamically adjusted with time in accordance with a radio frequency (RF) signal. The power supply modulation circuit includes a Transition Shaping Filter (filter circuit).

When the power supply modulation circuit in U.S. Pat. No. 8,829,993 is provided as a tracker module, there is a possibility that filter characteristics of the filter circuit deteriorate when the size of the tracker module is reduced.

SUMMARY OF THE INVENTION

Accordingly, it is an object of the present disclosure to provide a tracker module that supplies a power supply voltage to a power amplifier, reduces deterioration in filter characteristics, and is reduced in size. A radio frequency system and a communication device comprising the same are further disclosed.

According to an exemplary aspect, a tracker module is provided that includes a module laminate, an IC chip, and a filter circuit. The IC chip is disposed at the module laminate. The filter circuit includes a plurality of inductors. Moreover, The IC chip includes at least one switch included in a switched-capacitor circuit and at least one switch included in a supply modulator. The switched-capacitor circuit is configured to generate a plurality of discrete voltages based on an input voltage. The supply modulator is configured to selectively output at least one of the plurality of discrete voltages to the filter circuit. The plurality of inductors include a first inductor and a second inductor that are disposed at the module laminate and are adjacent to each other. A magnetic flux direction of the first inductor and a magnetic flux direction of the second inductor are perpendicular to each other.

According to another exemplary aspect, a tracker module is provided that includes a module laminate, an IC chip, and a filter circuit. The IC chip is disposed at the module laminate. The filter circuit includes a plurality of inductors. The IC chip includes at least one switch included in a switched-capacitor circuit and at least one switch included in a supply modulator. The switched-capacitor circuit is configured to generate a plurality of discrete voltages based on an input voltage. The supply modulator is configured to selectively output at least one of the plurality of discrete voltages to the filter circuit. The plurality of inductors include a first inductor and a second inductor that are disposed at the module laminate and are adjacent to each other. The first inductor and the second inductor have a rectangular shape in a plan view in a thickness direction of the module laminate. A longitudinal direction of the first inductor and a longitudinal direction of the second inductor are perpendicular to each other in a plan view in the thickness direction of the module laminate.

According to another exemplary aspect, a radio frequency system is provided that includes the tracker module and a power amplifier connected to the tracker module.

According to another exemplary aspect, a communication device is provided that includes the radio frequency system, and a signal processing circuit connected to the radio frequency system.

According to the tracker module, the radio frequency system, and the communication device according to the above aspects, the deterioration in filter characteristics of the tracker module and the size can both be reduced.

BRIEF DESCRIPTION OF THE DRAWINGS

FIG. 2 is a plan view of the tracker module according to Embodiment 1;

FIG. 4 is a circuit block diagram of a power supply circuit, a radio frequency system, and a communication device according to Embodiment 1;

DETAILED DESCRIPTION

Figure 1:
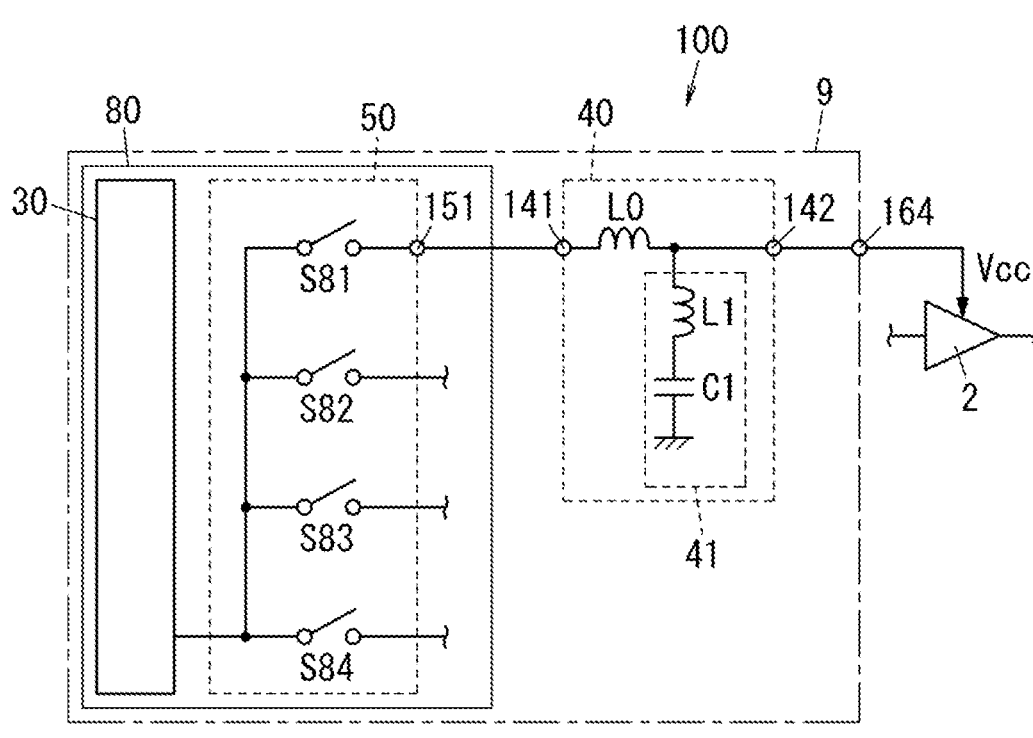
FIG. 1 is a conceptual diagram of a tracker module according to Embodiment 1.

Hereinafter, Exemplary Embodiments 1 to 10 will be described with reference to the drawings. The drawings referred to in the following embodiments or the like are schematic drawings. The size and thickness of the component in the drawings do not necessarily reflect actual dimensions, and the ratio of the sizes and the ratio of the thicknesses between the components do not necessarily reflect the actual dimensional ratios.

Embodiment 1

(1) Tracker Module

A tracker module 100 according to Embodiment 1 will be described with reference to the drawings.

Figure 2:
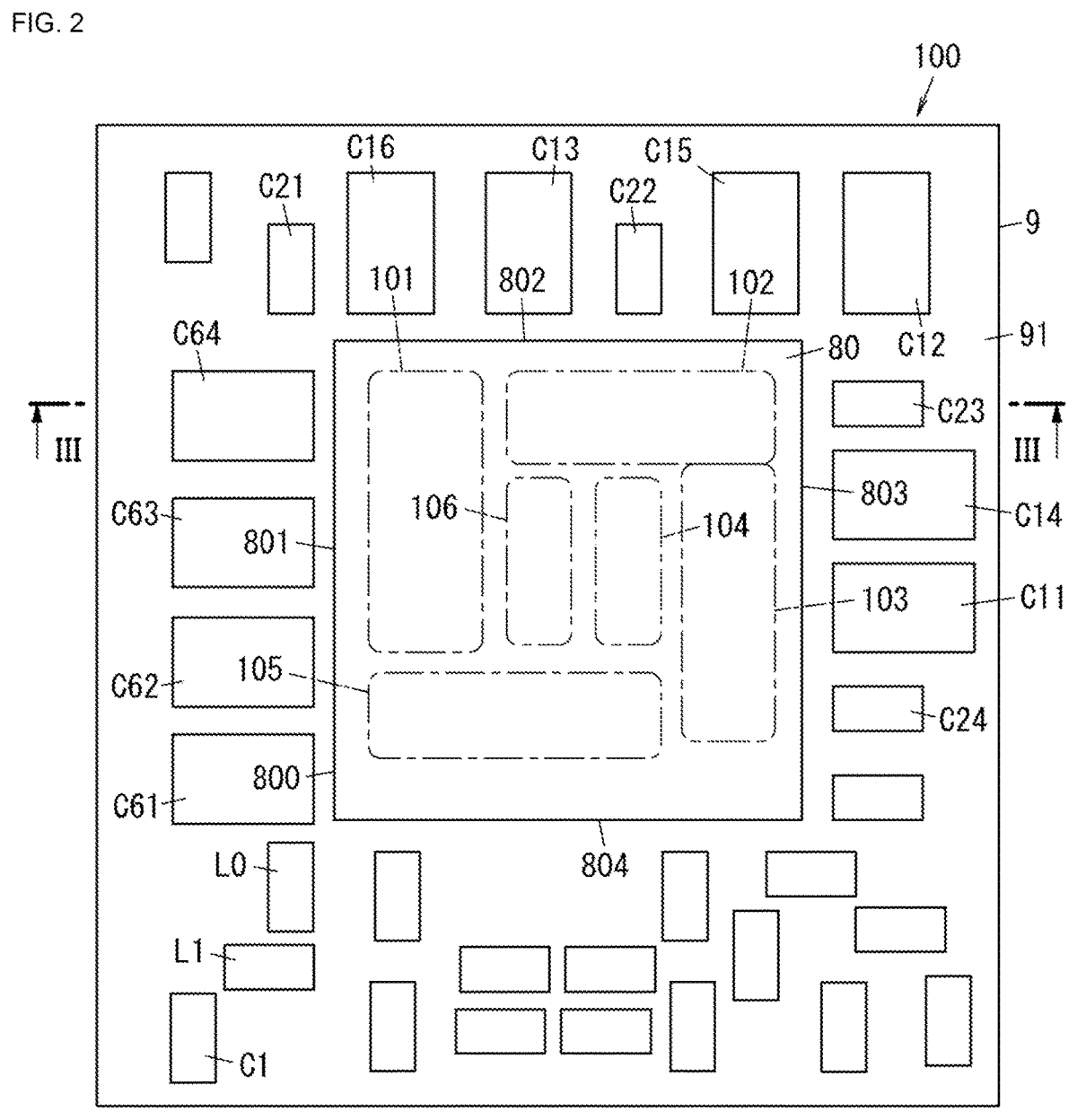
Figure 3:
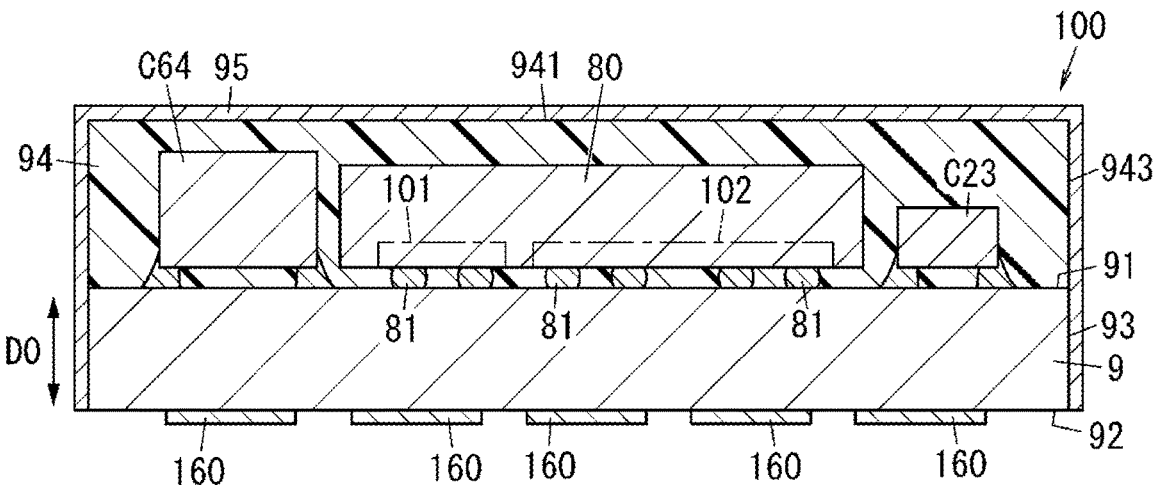
FIG. 3 illustrates the tracker module according to Embodiment 1, and is a cross-sectional view taken along line III-III in FIG. 2.

As shown, the tracker module 100 according to Embodiment 1 includes a module laminate 9, an IC chip 80, and a filter circuit 40 (see FIGS. 5 and 7), as illustrated in FIGS. 1 to 3. The IC chip 80 is disposed at the module laminate 9. The filter circuit 40 includes a plurality of inductors (e.g., a plurality of inductors L0 and L1 in the example of FIG. 6). The IC chip 80 includes at least one switch included in a switched-capacitor circuit 20 (see FIG. 6) and at least one switch included in a supply modulator 30 (see FIGS. 1 and 6). In operation, the switched-capacitor circuit 20 is configured to generate a plurality of discrete voltages based on an input voltage. The supply modulator 30 is configured to selectively output at least one of the plurality of discrete voltages to the filter circuit 40. For example, as illustrated in FIG. 4, the tracker module 100 is configured to be connected to a direct current (DC) power source 70 provided in a communication device 7 and to supply a power supply voltage Vcc to a power amplifier 2 provided in the communication device 7.

(2) Circuit Configurations of Power Supply Circuit, Radio Frequency System, and Communication Device Circuit configurations of a power supply circuit 1, a radio frequency system 200, and the communication device 7 according to Embodiment 1 will be described with reference to the drawings.

(2.1) Circuit Configuration of Radio Frequency System

Figure 4:
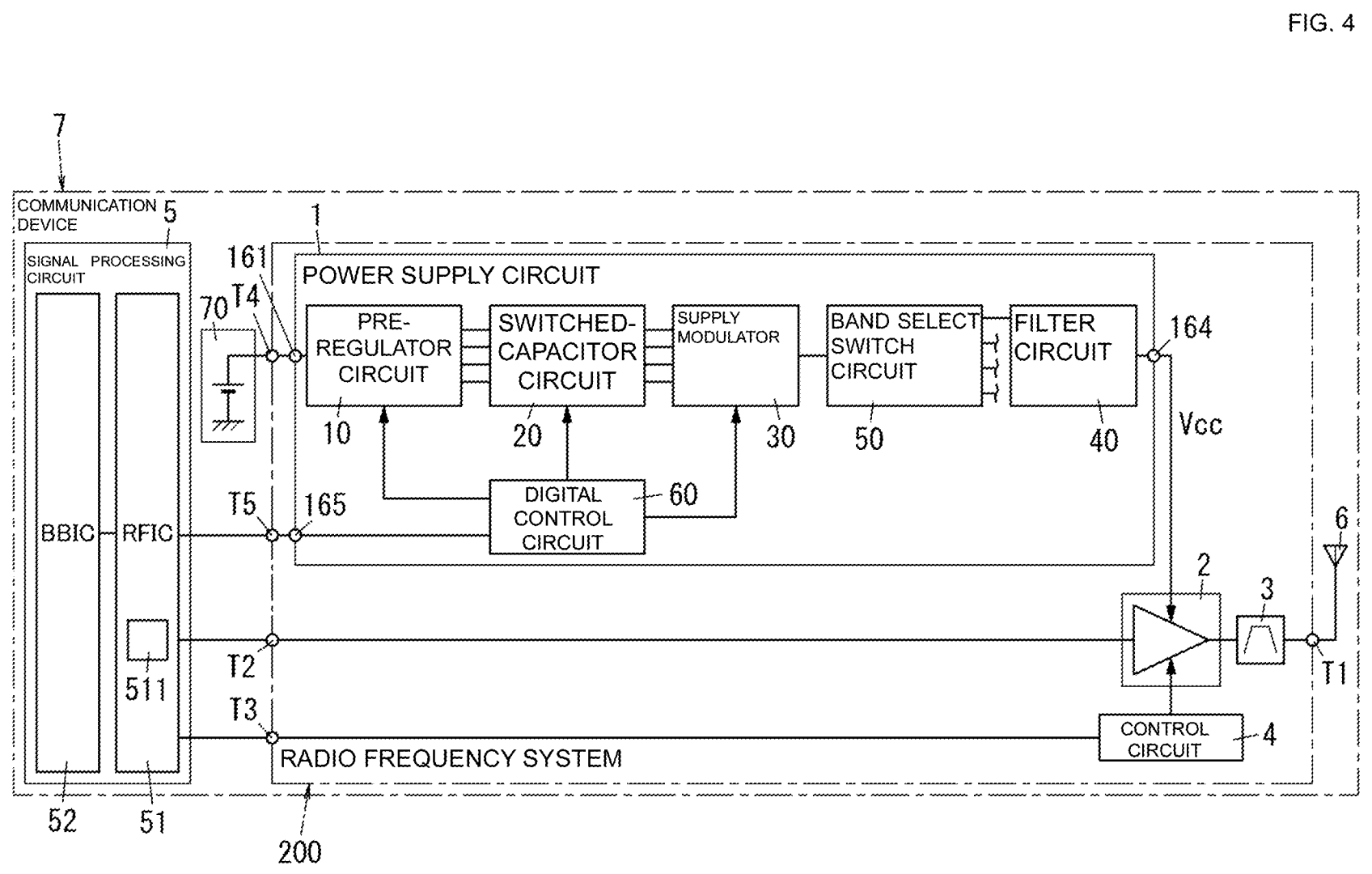

As illustrated in FIG. 4, the radio frequency system 200 includes a power supply circuit 1, a power amplifier 2, a filter 3, a control circuit 4, and a plurality of external connection terminals. The plurality of external connection terminals includes an antenna terminal T1, a signal input terminal T2, a first control terminal T3, a power source connection terminal T4, and four (only one is illustrated in FIG. 1) second control terminals T5.

The power supply circuit 1 is a circuit that is configured to supply, to the power amplifier 2, a power supply voltage Vcc having a voltage level selected from a plurality of discrete voltage levels based on an envelope signal.

In the communication device 7 including the power supply circuit 1 and the power amplifier 2, an envelope tracking method (referred to as an "ET method" below) can be used when the power amplifier 2 amplifies a radio frequency signal. The ET method includes an analog envelope tracking method (referred to as an "analog ET method" below) and a digital envelope tracking method (referred to as a "digital ET method" below).

The digital ET method is a method of tracking an envelope of a radio frequency signal (e.g., modulated signal) by using a plurality of discrete voltages having different voltage levels within one frame. A mode in which the digital ET method is applied to generate the power supply voltage Vcc is referred to as a digital ET mode. The analog ET method is a method of tracking an envelope of a radio frequency signal by using a continuous voltage level. A mode in which the analog ET method is applied to generate the power supply voltage Vcc is referred to as an analog ET mode.

For purposes of this disclosure, a frame represents a unit forming a radio frequency signal. For example, in 5th Generation New Radio (5G NR) and Long Term Evolution (LTE)®, a frame includes 10 subframes, each subframe includes a plurality of slots, and each slot includes a plurality of symbols. The subframe length is 1 ms, and the frame length is 10 ms.

Here, the digital ET mode and the analog ET mode will be described with reference to FIGS. 5A and 5B.

Figure 5A:
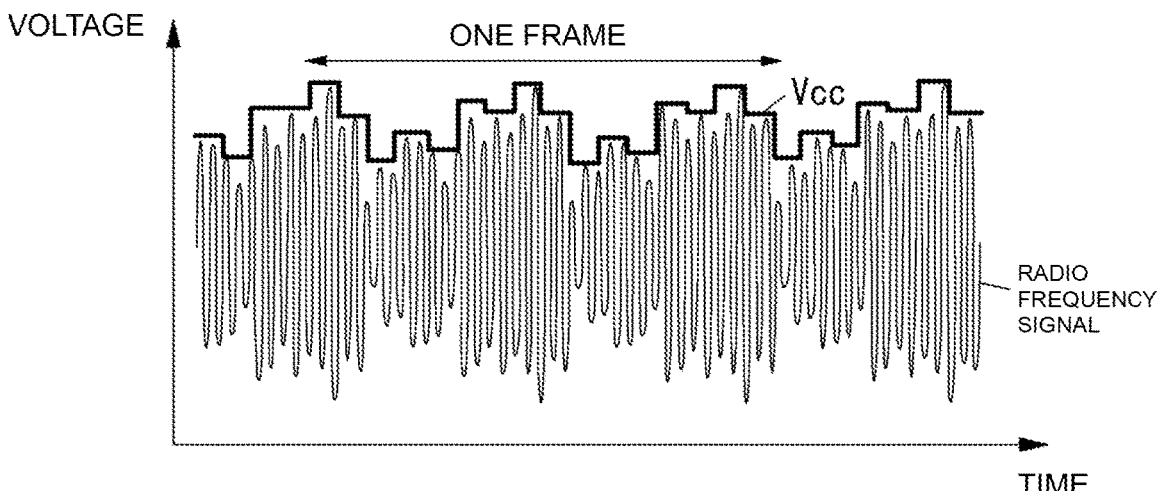
FIG. 5A is a waveform diagram illustrating an example of transition of a power supply voltage in a digital ET mode.

In the digital ET mode, as illustrated in FIG. 5A, the envelope of the radio frequency signal is tracked by causing the power supply voltage Vcc to fluctuate to a plurality of discrete voltage levels within one frame. As a result, the waveform of the power supply voltage Vcc becomes a rectangular waveform. In the digital ET mode, the power supply voltage level is selected from the plurality of discrete voltage levels based on the envelope signal.

Figure 5B:
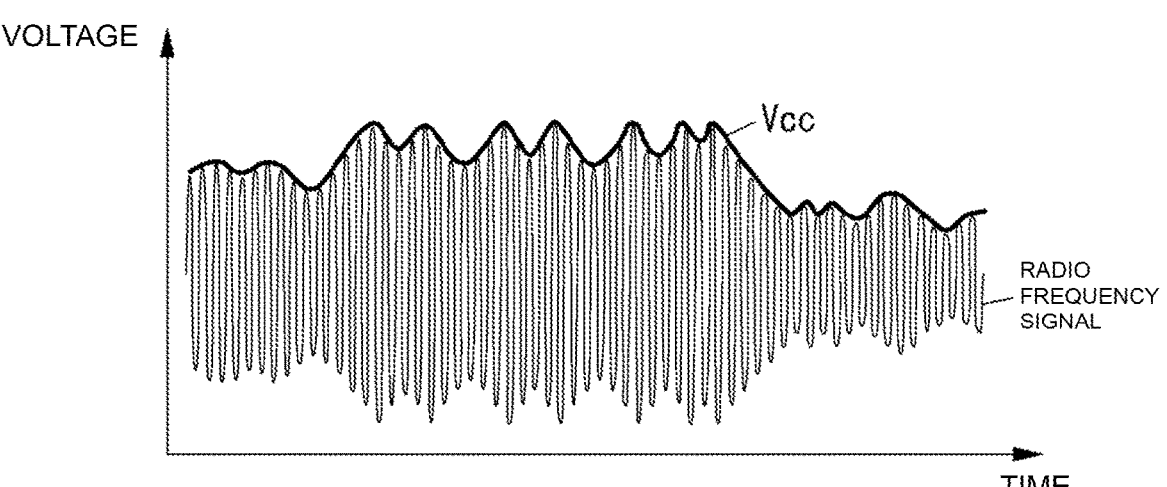
FIG. 5B is a waveform diagram illustrating an example of transition of the power supply voltage in an analog ET mode.

In the analog ET mode, as illustrated in FIG. 5B, the envelope of the radio frequency signal is tracked by causing the power supply voltage Vcc to continuously fluctuate. In the analog ET mode, the power supply voltage Vcc is determined based on the envelope signal. In the analog ET mode, when a channel band width is narrow (in a case where the channel band width is less than 60 MHz, for example), the power supply voltage Vcc easily follows the change in the envelope of the radio frequency signal, but when the channel band width is wide (in a case where the channel band width is equal to or more than, for example, 60 MHz), the power supply voltage Vcc has difficulty in following the change in the envelope of the radio frequency signal. In other words, when the channel band width is wide, the amplitude change of the power supply voltage Vcc is likely to be delayed with respect to the change in the envelope of the radio frequency signal.

On the other hand, when the channel band width is wide, the tracking ability of the power supply voltage Vcc to the radio frequency signal can be improved by applying the digital ET mode.

According to an exemplary aspect, the power supply circuit 1 includes a pre-regulator circuit 10, a switched-capacitor circuit 20, a supply modulator 30, and a filter circuit 40.

The pre-regulator circuit 10 is, for example, a direct current (DC)/DC converter that converts a DC voltage (e.g., a first voltage) supplied from the DC power source 70 provided in the communication device 7 into a second voltage. The pre-regulator circuit 10 is configured to perform a step-up operation of making the voltage value of the second voltage larger than the voltage value of the first voltage and a step-down operation of making the voltage value of the second voltage smaller than the voltage value of the first voltage. That is, the pre-regulator circuit 10 is a buck-boost DC-DC converter.

The switched-capacitor circuit 20 is configured to generate a plurality of discrete voltages (e.g., a plurality of third voltages) by using the second voltage from the pre-regulator circuit 10 as an input voltage. The plurality of discrete voltages has voltage levels different from each other. The switched-capacitor circuit 20 may be referred to as a switched-capacitor voltage balancer.

The supply modulator 30 is configured to selectively output, to the filter circuit 40, at least one of the plurality of discrete voltages (e.g., the plurality of third voltages) generated by the switched-capacitor circuit 20 based on a digital control signal corresponding to the envelope signal. The supply modulator 30 outputs at least one discrete voltage selected from the plurality of discrete voltages. In the power supply circuit 1, the voltage level of an output voltage (e.g., power supply voltage Vcc) of the supply modulator 30 can be changed with time by repeating the selection of the discrete voltage in the supply modulator 30 with time. Thus, the power supply circuit 1 can change the voltage level of the power supply voltage Vcc supplied to the power amplifier 2 with time.

The filter circuit 40 is configured to filter the output voltage of the supply modulator 30. The filter circuit 40 includes, for example, a low pass filter.

Moreover, the filter circuit 40 reduces the amplitude of a spike-shaped voltage of the output voltage output from the supply modulator 30. That is, the power supply circuit 1 includes the filter circuit 40, and thus can reduce the waveform distortion of the output voltage output from the supply modulator 30. Thus, a radio frequency component of the output voltage can be reduced. As a result, in the power supply circuit 1, noise included in the power supply voltage Vcc can be reduced, and thus it is possible to also reduce noise that enters the power amplifier 2 from the power supply circuit 1.

The power amplifier 2 has an input terminal, an output terminal, a power supply terminal, and a control terminal. The input terminal of the power amplifier 2 is connected to the signal processing circuit 5 of the communication device 7 through the signal input terminal T2. The output terminal of the power amplifier 2 is connected to an antenna 6 of the communication device 7 through the filter 3 and the antenna terminal T1. The power amplifier 2 amplifies a radio frequency transmission signal (referred to as a transmission signal below) in a predetermined band, which is outputted from the signal processing circuit 5 and outputs the amplified signal.

The filter 3 is connected between the output terminal of the power amplifier 2 and the antenna terminal T1. The filter 3 has a passband that includes a frequency band of a predetermined band. Thus, the filter 3 can cause the transmission signal in the predetermined band amplified by the power amplifier 2 to pass through the filter 3. In the radio frequency system 200, the transmission signal output from the power amplifier 2 is output to the antenna 6 through the filter 3 and the antenna terminal T1.

The control circuit 4 is connected to an RF signal processing circuit 51 of the signal processing circuit 5 through the first control terminal T3. The control circuit 4 is connected to the control terminal of the power amplifier 2. The control circuit 4 controls the magnitude and a supply timing of a bias current (or bias voltage) to be supplied to the control terminal of the power amplifier 2 by receiving a control signal from the RF signal processing circuit 51 of the signal processing circuit 5.

(2.2) Communication Device

As illustrated in FIG. 4, the communication device 7 includes the radio frequency system 200, the signal processing circuit 5, the antenna 6, and the DC power source 70.

The DC power source 70 is, for example, a rechargeable battery. However, it is noted that the DC power source 70 is not limited to the rechargeable battery, and may be another battery as would be appreciated to one skilled in the art.

The antenna 6 is configured to transmit a transmission signal in a predetermined band output from the antenna terminal T1.

The signal processing circuit 5 includes the RF signal processing circuit 51 and a baseband signal processing circuit 52. The RF signal processing circuit 51 is, for example, a radio frequency integrated circuit (RF IC) and performs signal processing on a radio frequency signal. For example, the RF signal processing circuit 51 performs signal processing, such as upconverting, on a radio frequency signal (e.g., transmission signal) outputted from the baseband signal processing circuit 52, and outputs the radio frequency signal subjected to the signal processing. The baseband signal processing circuit 52 is, for example, a baseband integrated circuit (BB IC). The baseband signal processing circuit 52 generates an I phase signal and a Q phase signal from a baseband signal. The baseband signal is, for example, an audio signal or an image signal inputted from the outside. The baseband signal processing circuit 52 performs IQ modulation processing by combining the I phase signal and the Q phase signal, and outputs the transmission signal. At this time, the transmission signal is generated as a modulation signal (e.g., an IQ signal) in which a carrier wave signal of a predetermined frequency is amplitude-modulated in a period longer than a period of the carrier wave signal.

The RF signal processing circuit 51 includes a control unit 511 that is configured to control the power supply circuit 1 and the power amplifier 2. The control unit 511 of the RF signal processing circuit 51 causes the supply modulator 30 to select the voltage level of the power supply voltage Vcc used in the power amplifier 2 from the voltage levels of the plurality of discrete voltages generated by the switched-capacitor circuit 20, based on the envelope signal of the radio frequency input signal input from the baseband signal processing circuit 52. Thus, the power supply circuit 1 outputs the power supply voltage Vcc based on the digital envelope tracking. The envelope signal is a signal indicating an envelope of a radio frequency signal (modulated signal). The envelope value is, for example, $(I^2+Q^2)^{1/2}$. Here, (I, Q) represents a constellation point. The constellation point is a point representing a signal modulated by digital modulation on a constellation diagram. (I, Q) is determined by the baseband signal processing circuit 52, for example, based on transmission information. Some or all of the functions of the RF signal processing circuit 51 as the control unit 511 may be outside the RF signal processing circuit 51. For example, the baseband signal processing circuit 52 or the power supply circuit 1 may include some or all of the functions of the RF signal processing circuit 51 as the control unit 511. For example, the control function that causes the supply modulator 30 to select the voltage level of the power supply voltage Vcc does not need to be provided in the RF signal processing circuit 51, but may be provided in the power supply circuit 1.

(2.3) Power Supply Circuit

Figure 6:
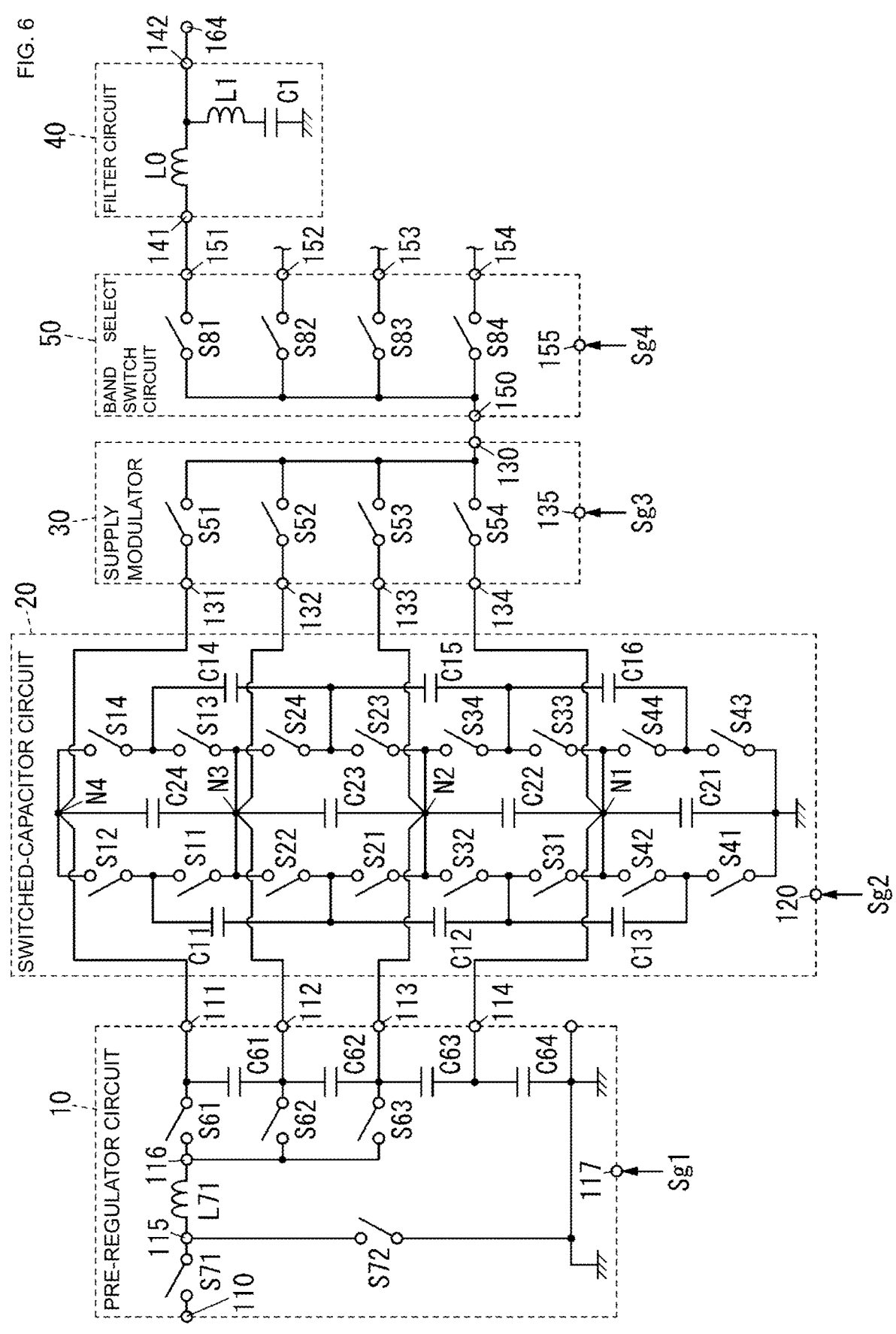
FIG. 6 is a circuit diagram of a power supply circuit according to Embodiment 1.

As illustrated in FIG. 6, the power supply circuit 1 includes a pre-regulator circuit 10, a switched-capacitor circuit 20, a supply modulator 30, a filter circuit 40, a band select switch circuit 50, and a digital control circuit 60.

(2.4) Pre-Regulator Circuit

As illustrated in FIG. 6, the pre-regulator circuit 10 includes an input terminal 110, a plurality (four in the example of FIG. 6) of output terminals 111 to 114, a plurality of inductor connection terminals 115 and 116, a control terminal 117, and a plurality (five in the example of FIG. 6) of switches S61, S62, S63, S71, and S72, a power inductor L71, and a plurality (four in the example of FIG. 6) of capacitors C61, C62, C63, and C64. The power inductor L71 is an inductor used to step up and/or step down a DC voltage (step-up, step-down, or step-up/down).

The input terminal 110 is an input terminal of a DC voltage. That is, the input terminal 110 is a terminal for receiving an input voltage from the DC power source 70 (see FIG. 4).

The output terminal 111 is an output terminal of a voltage V4. That is, the output terminal 111 is a terminal for supplying the voltage V4 to the switched-capacitor circuit 20. The output terminal 111 is connected to a node N4 of the switched-capacitor circuit 20.

The output terminal 112 is an output terminal of a voltage V3. That is, the output terminal 112 is a terminal for supplying the voltage V3 to the switched-capacitor circuit 20. The output terminal 112 is connected to a node N3 of the switched-capacitor circuit 20.

The output terminal 113 is an output terminal of a voltage V2. That is, the output terminal 113 is a terminal for supplying the voltage V2 to the switched-capacitor circuit 20. The output terminal 113 is connected to a node N2 of the switched-capacitor circuit 20.

The output terminal 114 is an output terminal of a voltage V1. That is, the output terminal 114 is a terminal for supplying the voltage V1 to the switched-capacitor circuit 20. The output terminal 114 is connected to a node N1 of the switched-capacitor circuit 20.

The inductor connection terminal 115 is connected to one end (e.g., the first end) of the power inductor L71. The inductor connection terminal 116 is connected to the other end (e.g., the second end) of the power inductor L71.

The control terminal 117 is an input terminal of a control signal Sg1. That is, the control terminal 117 is a terminal for receiving the control signal Sg1 for controlling the pre-regulator circuit 10. The control signal Sg1 is a signal for controlling on/off of the plurality of switches S61 to S63, S71, and S72 included in the pre-regulator circuit 10.

The switch S71 is connected between the input terminal 110 and one end (e.g., the first end) of the power inductor L71. Specifically, the switch S71 has a first terminal that is connected to the input terminal 110 and a second terminal that is connected to one end (e.g., the first end) of the power inductor L71 through the inductor connection terminal 115. In the above connection configuration, the switch S71 performs switching between connection and disconnection between the input terminal 110 and one end of the power inductor L71 by performing switching between on and off.

The switch S72 is connected between the one end (e.g., the first end) of the power inductor L71 and the ground. Specifically, the switch S72 has a first terminal that is connected to the one end (e.g., the first end) of the power inductor L71 via the inductor connection terminal 115 and a second terminal that is connected to the ground. In the above connection configuration, the switch S72 performs switching between connection and disconnection between the one end of the power inductor L71 and the ground by performing switching between on and off.

The switch S61 is connected between the other end (e.g., the second end) of the power inductor L71 and the output terminal 111. Specifically, the switch S61 has a first terminal that is connected to the other end (e.g., the second end) of the power inductor L71 and a second terminal that is connected to the output terminal 111. In the above connection configuration, the switch S61 performs switching between connection and disconnection between the other end of the power inductor L71 and the output terminal 111 by performing switching between on and off.

The switch S62 is connected between the other end (e.g., the second end) of the power inductor L71 and the output terminal 112. Specifically, the switch S62 has a first terminal that is connected to the other end (e.g., the second end) of the power inductor L71 and a second terminal that is connected to the output terminal 112. In the above connection configuration, the switch S62 performs switching between connection and disconnection between the other end of the power inductor L71 and the output terminal 112 by performing switching between on and off.

The switch S63 is connected between the other end (e.g., the second end) of the power inductor L71 and the output terminal 113. Specifically, the switch S63 has a first terminal that is connected to the other end (e.g., the second end) of the power inductor L71 and a second terminal that is connected to the output terminal 113. In the above connection configuration, the switch S63 performs switching between connection and disconnection between the other end of the power inductor L71 and the output terminal 113 by performing switching between on and off.

The capacitor C61 is connected between the output terminal 111 and the output terminal 112. One of two electrodes of the capacitor C61 is connected to the switch S61 and the output terminal 111, and the other of the two electrodes of the capacitor C61 is connected to the switch S62 and the output terminal 112, and one of two electrodes of the capacitor C62.

The capacitor C62 is connected between the output terminal 112 and the output terminal 113. One of the two electrodes of the capacitor C62 is connected to the switch S62 and the output terminal 112, and the other of the two electrodes of the capacitor C61. The other of the two electrodes of the capacitor C62 is connected to the switch S63 and the output terminal 113, and one of two electrodes of the capacitor C63.

The capacitor C63 is connected between the output terminal 113 and the output terminal 114. One of the two electrodes of the capacitor C63 is connected to the switch S63 and the output terminal 113, and the other of the two electrodes of the capacitor C62. The other of the two electrodes of the capacitor C63 is connected to the output terminal 114 and one of two electrodes of the capacitor C64.

The capacitor C64 is connected between the output terminal 114 and the ground. One of the two electrodes of the capacitor C64 is connected to the output terminal 114 and the other of the two electrodes of the capacitor C63. The other of the two electrodes of the capacitor C64 is connected to the ground.

The plurality of switches S61 to S63 are controlled to be exclusively turned on. That is, only one of the switches S61 to S63 is turned on, and the rest of the switches S61 to S63 are turned off. The voltage levels of the voltages V1 to V4 can be changed depending on which of the switches S61 to S63 are turned on.

The pre-regulator circuit 10 configured as described above supplies charges to the switched-capacitor circuit 20 through at least one of the plurality of output terminals 111 to 113.

(2.5) Switched-Capacitor Circuit

As illustrated in FIG. 6, the switched-capacitor circuit 20 includes a plurality (six in the example of FIG. 6) of capacitors C11 to C16, a plurality (four in the example of FIG. 6) of capacitors C21 to C24, and a plurality (sixteen in the example of FIG. 6), of switches S11 to S14, S21 to S24, S31 to S34, and S41 to S44, and a control terminal 120.

The control terminal 120 is an input terminal of a control signal Sg2 from the digital control circuit 60. The control signal Sg2 is a signal for controlling on/off of the plurality of switches S11 to S14, S21 to S24, S31 to S34, and S41 to S44 included in the switched-capacitor circuit 20.

Each of the plurality of capacitors C11 to C16 functions as a flying capacitor (transfer capacitor). That is, each of the plurality of capacitors C11 to C16 is used to step up or step down the voltage (input voltage) supplied from the pre-regulator circuit 10. More specifically, the plurality of capacitors C11 to C16 move charges between the capacitors C11 to C16 and the nodes N1 to N4 so that the voltages V1 to V4 (voltage with respect to the ground potential) that satisfy V1:V2:V3:V4=1:2:3:4 at the four nodes N1 to N4. The plurality of voltages V1 to V4 correspond to a plurality of discrete voltages having a plurality of discrete voltage levels, respectively. The voltage V1 is a voltage at the node N1, the voltage V2 is a voltage at the node N2, the voltage V3 is a voltage at the node N3, and the voltage V4 is a voltage at the node N4.

The capacitor C11 has two electrodes. One of the two electrodes of the capacitor C11 is connected to one end (e.g., the first end) of the switch S11 and one end (e.g., the first end) of the switch S12. The other of the two electrodes of the capacitor C11 is connected to one end (e.g., the first end) of the switch S21 and one end (e.g., the first end) of the switch S22.

The capacitor C12 has two electrodes. One of the two electrodes of the capacitor C12 is connected to the one end (e.g., the first end) of the switch S21 and the one end (e.g., the first end) of the switch S22. The other of the two electrodes of the capacitor C12 is connected to one end (e.g., the first end) of the switch S31 and one end (e.g., the first end) of the switch S32.

In the switched-capacitor circuit 20, the capacitor C12 is an example of a first capacitor, one of the two electrodes of the capacitor C12 configures a first electrode of the first capacitor, and the other of the two electrodes of the capacitor C12 configures a second electrode of the first capacitor.

The capacitor C13 has two electrodes. One of the two electrodes of the capacitor C13 is connected to one end (e.g., the first end) of the switch S31 and one end (e.g., the first end) of the switch S32. The other of the two electrodes of the capacitor C13 is connected to one end (e.g., the first end) of the switch S41 and one end (e.g., the first end) of the switch S42.

The capacitor C14 has two electrodes. One of the two electrodes of the capacitor C14 is connected to one end (e.g., the first end) of the switch S13 and one end (e.g., the first end) of the switch S14. The other of the two electrodes of the capacitor C14 is connected to one end (e.g., the first end) of the switch S23 and one end (e.g., the first end) of the switch S24.

The capacitor C15 has two electrodes. One of the two electrodes of the capacitor C15 is connected to the one end (e.g., the first end) of the switch S23 and the one end (e.g., the first end) of the switch S24. The other of the two electrodes of the capacitor C15 is connected to one end (e.g., the first end) of the switch S33 and one end (e.g., the first end) of the switch S34.

In the switched-capacitor circuit 20, the capacitor C15 is an example of a second capacitor, one of the two electrodes of the capacitor C15 configures a third electrode of the second capacitor, and the other of the two electrodes of the capacitor C15 configures a fourth electrode of the second capacitor.

The capacitor C16 has two electrodes. One of the two electrodes of the capacitor C16 is connected to the one end (e.g., the first end) of the switch S33 and the one end (e.g., the first end) of the switch S34. The other of the two electrodes of the capacitor C16 is connected to one end (e.g., the first end) of the switch S43 and one end (e.g., the first end) of the switch S44.

Each of a set of the capacitors C11 and C14, a set of the capacitors C12 and C15, and a set of the capacitors C13 and C16 can be complementarily charged and discharged by repeating a first phase and a second phase.

In the first phase, the switches S12, S13, S22, S23, S32, S33, S42, and S43 are turned on. As a result, for example, one (first electrode) of the two electrodes of the capacitor C12 (first capacitor) is connected to the node N3. The other (second electrode) of the two electrodes of the capacitor C12 and one (third electrode) of the two electrodes of the capacitor C15 (second capacitor) is connected to the node N2. The other (fourth electrode) of the two electrodes of the capacitor C15 is connected to the node N1.

In the second phase, the switches S11, S14, S21, S24, S31, S34, S41, and S44 are turned on. As a result, for example, one (third electrode) of the two electrodes of the capacitor C15 (second capacitor) is connected to the node N3. The other (fourth electrode) of the two electrodes of the capacitor C15 (second capacitor) and one (first electrode) of the two electrodes of the capacitor C12 (first capacitor) are connected to the node N2. The other (second electrode) of the two electrodes of the capacitor C12 (first capacitor) is connected to the node N1.

By repeating the first phase and the second phase, for example, when one of the capacitors C12 and C15 is charged from the node N2, the other of the capacitors C12 and C15 can be discharged to the capacitor C23. That is, the capacitors C12 and C15 can be complementarily charged and discharged. The capacitors C12 and C15 are a pair of flying capacitors that are complementarily charged and discharged.

Similarly to the set of the capacitors C12 and C15, the set of the capacitors C11 and C14 are a pair of flying capacitors that are complementarily charged from the node and discharged to a smoothing capacitor, by appropriately switching the switch. Similarly to the set of the capacitors C12 and C15, the set of the capacitors C13 and C16 are a pair of flying capacitors that are complementarily charged from the node and discharged to a smoothing capacitor, by appropriately switching the switch.

Each of the plurality of capacitors C21 to C24 functions as a smoothing capacitor. That is, the capacitors C21 to C24 are configured to hold and smooth the voltages V1 to V4 at the nodes N1 to N4, respectively.

The capacitor C21 is connected between the node N1 and the ground. Specifically, one of the two electrodes of the capacitor C21 is connected to the node N1. On the other hand, the other (sixth electrode) of the two electrodes of the capacitor C21 is connected to the ground.

The capacitor C22 is connected between the node N2 and the node N1. Specifically, one of the two electrodes of the capacitor C22 is connected to the node N2. On the other hand, the other of the two electrodes of the capacitor C22 is connected to the node N1.

The capacitor C23 is connected between the node N3 and the node N2. Specifically, one of the two electrodes of the capacitor C23 is connected to the node N3. On the other hand, the other of the two electrodes of the capacitor C23 is connected to the node N2.

The capacitor C24 is connected between the node N4 and the node N3. Specifically, one of the two electrodes of the capacitor C24 is connected to the node N4. On the other hand, the other of the two electrodes of the capacitor C24 is connected to the node N3.

The switch S11 is connected between one of the two electrodes of the capacitor C11 and the node N3. Specifically, the one end (e.g., the first end) of the switch S11 is connected to one of the two electrodes of the capacitor C11. On the other hand, the other end (e.g., the second end) of the switch S11 is connected to the node N3.

The switch S12 is connected between one of the two electrodes of the capacitor C11 and the node N4. Specifically, the one end (e.g., the first end) of the switch S12 is connected to one of the two electrodes of the capacitor C11. On the other hand, the other end (e.g., the second end) of the switch S12 is connected to the node N4.

The switch S21 is connected between one (first electrode) of the two electrodes of the capacitor C12 (first capacitor) and the node N2. Specifically, the one end (e.g., the first end) of the switch S21 is connected to the one (first electrode) of the two electrodes of the capacitor C12 (first capacitor) and the other of the two electrodes of the capacitor C11. On the other hand, the other end (e.g., the second end) of the switch S21 is connected to the node N2. In the switched-capacitor circuit 20, the switch S21 is an example of a first switch.

The switch S22 is connected between one (first electrode) of the two electrodes of the capacitor C12 and the node N3. Specifically, the one end (e.g., the first end) of the switch S22 is connected to one (first electrode) of the two electrodes of the capacitor C12 and the other of the two electrodes of the capacitor C11. On the other hand, the other end (e.g., the second end) of the switch S22 is connected to the node N3. In the switched-capacitor circuit 20, the switch S22 is an example of a third switch.

The switch S31 is connected between the other (second electrode) of the two electrodes of the capacitor C12 (first capacitor) and the node N1. Specifically, the one end (e.g., the first end) of the switch S31 is connected to the other (second electrode) of the two electrodes of the capacitor C12 (first capacitor) and one of the two electrodes of the capacitor C13. On the other hand, the other end (e.g., the second end) of the switch S31 is connected to the node N1. In the switched-capacitor circuit 20, the switch S31 is an example of a fourth switch.

The switch S32 is connected between the other (second electrode) of the two electrodes of the capacitor C12 (first capacitor) and the node N2. Specifically, one end (e.g., the first end) of the switch S32 is connected to the other (second electrode) of the two electrodes of the capacitor C12 and one of the two electrodes of the capacitor C13. On the other hand, the other end (e.g., the second end) of the switch S32 is connected to the node N2. That is, the other end (e.g., the second end) of the switch S32 is connected to the other end (e.g., the second end) of the switch S21. In the switched-capacitor circuit 20, the switch S32 is an example of a second switch.

The switch S41 is connected between the other of the two electrodes of the capacitor C13 and the ground. Specifically, the one end (e.g., the first end) of the switch S41 is connected to the other of the two electrodes of the capacitor C13. On the other hand, the other end (e.g., the second end) of the switch S41 is connected to the ground.

The switch S42 is connected between the other of the two electrodes of the capacitor C13 and the node N1. Specifically, the one end (e.g., the first end) of the switch S42 is connected to the other of the two electrodes of the capacitor C13. On the other hand, the other end (e.g., the second end) of the switch S42 is connected to the node N1. That is, the other end (e.g., the second end) of the switch S42 is connected to the other end (e.g., the second end) of the switch S31.

The switch S13 is connected between one of the two electrodes of the capacitor C14 and the node N3. Specifically, one end (e.g., the first end) of the switch S13 is connected to one of the two electrodes of the capacitor C14. On the other hand, the other end (e.g., the second end) of the switch S13 is connected to the node N3. That is, the other end (e.g., the second end) of the switch S13 is connected to the other end (e.g., the second end) of the switch S11 and the other end (e.g., the second end) of the switch S22.

The switch S14 is connected between one of the two electrodes of the capacitor C14 and the node N4. Specifically, the one end (e.g., the first end) of the switch S14 is connected to one of the two electrodes of the capacitor C14. On the other hand, the other end (e.g., the second end) of the switch S14 is connected to the node N4. That is, the other end (e.g., the second end) of the switch S14 is connected to the other end (e.g., the second end) of the switch S12.

The switch S23 is connected between one (third electrode) of the two electrodes of the capacitor C15 (second capacitor) and the node N2. Specifically, the one end (e.g., the first end) of the switch S23 is connected to one (third electrode) of the two electrodes of the capacitor C15 and the other of the two electrodes of the capacitor C14. On the other hand, the other end (e.g., the second end) of the switch S23 is connected to the node N2. That is, the other end (e.g., the second end) of the switch S23 is connected to the other end (e.g., the second end) of the switch S21 and the other end (e.g., the second end) of the switch S32. In the switched-capacitor circuit 20, the switch S23 is an example of a fifth switch.

The switch S24 is connected between one (third electrode) of the two electrodes of the capacitor C15 (second capacitor) and the node N3. Specifically, the one end (e.g., the first end) of the switch S24 is connected to one (third electrode) of the two electrodes of the capacitor C15 and the other of the two electrodes of the capacitor C14. On the other hand, the other end (e.g., the second end) of the switch S24 is connected to the node N3. That is, the other end (e.g., the second end) of the switch S24 is connected to the other end (e.g., the second end) of the switch S11, the other end (e.g., the second end) of the switch S22, and the other end (e.g., the second end) of the switch S13. In the switched-capacitor circuit 20, the switch S24 is an example of a seventh switch.

The switch S33 is connected between the other of the two electrodes of the capacitor C15 (second capacitor) and the node N1. Specifically, the one end (e.g., the first end) of the switch S33 is connected to the other (fourth electrode) of the two electrodes of the capacitor C15 and one of the two electrodes of the capacitor C16. On the other hand, the other end (e.g., the second end) of the switch S33 is connected to the node N1. That is, the other end (e.g., the second end) of the switch S33 is connected to the other end (e.g., the second end) of the switch S31 and the other end (e.g., the second end) of the switch S42. In the switched-capacitor circuit 20, the switch S33 is an example of an eighth switch.

The switch S34 is connected between the other (fourth electrode) of the two electrodes of the capacitor C15 (second capacitor) and the node N2. Specifically, the one end (e.g., the first end) of the switch S34 is connected to the other (fourth electrode) of the two electrodes of the capacitor C15 and one of the two electrodes of the capacitor C16. On the other hand, the other end (e.g., the second end) of the switch S34 is connected to the node N2. That is, the other end (e.g., the second end) of the switch S34 is connected to the other end (e.g., the second end) of the switch S21, the other end (e.g., the second end) of the switch S32, and the other end (e.g., the second end) of the switch S23. In the switched-capacitor circuit 20, the switch S34 is an example of a sixth switch.

The switch S43 is connected between the other of the two electrodes of the capacitor C16 and the ground. Specifically, the one end (e.g., the first end) of the switch S43 is connected to the other of the two electrodes of the capacitor C16. On the other hand, the other end (e.g., the second end) of the switch S43 is connected to the ground.

The switch S44 is connected between the other of the two electrodes of the capacitor C16 and the node N1. Specifically, the one end (e.g., the first end) of the switch S44 is connected to the other of the two electrodes of the capacitor C16. On the other hand, the other end (e.g., the second end) of the switch S44 is connected to the node N1. That is, the other end (e.g., the second end) of the switch S44 is connected to the other end (e.g., the second end) of the switch S31, the other end (e.g., the second end) of the switch S42, and the other end (e.g., the second end) of the switch S33.

On and off are complementarily switched between a first set of switches including the switches S12, S13, S22, S23, S32, S33, S42, and S43 and a second set of switches including the switches S11, S14, S21, S24, S31, S34, S41, and S44. Specifically, in the first phase, the first set of switches is turned on, and the second set of switches is turned off. Conversely, in the second phase, the first set of switches is turned off, and the second set of switches is turned on.

For example, charging from the capacitors C11 to C13 to the capacitors C21 to C24 is performed in one of the first phase and the second phase, and charging from the capacitors C14 to C16 to the capacitors C21 to C24 is performed in the other of the first phase and the second phase. That is, the capacitors C21 to C24 are normally charged from the capacitors C11 to C13 or the capacitors C14 to C16. Thus, even though a current flows from the nodes N1 to N4 to the supply modulator 30 at a high speed, it is possible to suppress the potential fluctuations of the nodes N1 to N4 because the charges are replenished at the nodes N1 to N4 at a high speed.

By operating as described above, the switched-capacitor circuit 20 can maintain substantially the same voltage at both ends of each of the capacitors C21 to C24. Specifically, the voltages V1 to V4 (voltage with respect to the ground potential) that satisfy V1:V2:V3:V4=1:2:3:4 are maintained at the four nodes NI to N4. The voltage levels of the voltages V1 to V4 correspond to a plurality of discrete voltage levels supplied to the supply modulator 30 by the switched-capacitor circuit 20.

It is noted that the voltage ratio V1:V2:V3:V4 is not limited to 1:2:3:4. For example, the voltage ratio V1:V2:V3:V4 may be 1:2:4:8 in another exemplary aspect.

(2.6) Supply Modulator

As illustrated in FIG. 6, the supply modulator 30 includes a plurality (four in the example of FIG. 6) of input terminals 131 to 134, a plurality (four in the example of FIG. 6) of switches S51 to S54, an output terminal 130, and a control terminal 135.

The output terminal 130 is connected to the filter circuit 40. The output terminal 130 is a terminal for supplying a voltage selected from the voltages V1 to V4 to the power amplifier 2 through the filter circuit 40 as the power supply voltage Vcc.

The plurality of input terminals 131 to 134 are connected to the nodes N4 to N1 of the switched-capacitor circuit 20, respectively. The plurality of input terminals 131 to 134 are terminals for receiving the voltages V4 to V1 from the switched-capacitor circuit 20.

The control terminal 135 is an input terminal of a control signal Sg3 from the digital control circuit 60. The control signal Sg3 is a signal for controlling on/off of the plurality of switches S51 to S54 included in the supply modulator 30. The supply modulator 30 controls on/off of the plurality of switches S51 to S54 based on the control signal Sg3.

The switch S51 is connected between the input terminal 131 and the output terminal 130. Specifically, the switch S51 has a first terminal that is connected to the input terminal 131 and a second terminal that is connected to the output terminal 130. In the above connection configuration, the switch S51 performs switching between the connection and the disconnection between the input terminal 131 and the output terminal 130 by performing switching between on and off.

The switch S52 is connected between the input terminal 132 and the output terminal 130. Specifically, the switch S52 has a first terminal that is connected to the input terminal 132 and a second terminal that is connected to the output terminal 130. In the above connection configuration, the switch S52 performs switching between the connection and the disconnection between the input terminal 132 and the output terminal 130 by performing switching between on and off. In the supply modulator 30, the switch S52 is an example of a tenth switch.

The switch S53 is connected between the input terminal 133 and the output terminal 130. Specifically, the switch S53 has a first terminal that is connected to the input terminal 133 and a second terminal that is connected to the output terminal 130. In the above connection configuration, the switch S53 performs switching between the connection and the disconnection between the input terminal 133 and the output terminal 130 by performing switching between on and off. In the supply modulator 30, the switch S53 is an example of a ninth switch.

The switch S54 is connected between the input terminal 134 and the output terminal 130. Specifically, the switch S54 has a first terminal that is connected to the input terminal 134 and a second terminal that is connected to the output terminal 130. In the above connection configuration, the switch S54 performs switching between the connection and the disconnection between the input terminal 134 and the output terminal 130 by performing switching between on and off.

The plurality of switches S51 to S54 are controlled to be exclusively turned on. That is, only one of the switches S51 to S54 is turned on, and the rest of the switches S51 to S54 are turned off. As a result, the supply modulator 30 can output one voltage selected from the voltages V1 to V4.

The supply modulator 30 has the above configuration, so that the digital control signal corresponding to the envelope signal is input from the control terminal 135, and controls on/off of the plurality of switches S51 to S54 based on the digital control signal input from the control terminal 135 to select at least one of the plurality of voltages V1 to V4 generated by the switched-capacitor circuit 20. The supply modulator 30 outputs the selected voltage.

It should be appreciated that the waveform of the output voltage of the supply modulator 30 does not need be a rectangular wave including only a plurality of discrete voltages. Specifically, the waveform of the output voltage of the supply modulator 30 becomes a waveform distorted from the rectangular wave by an overshoot voltage (e.g., spike-shaped voltage) being generated when the voltage transitions from a discrete voltage having a relatively low voltage level to a discrete voltage having a relatively high voltage level. In addition, the waveform of the output voltage of the supply modulator 30 becomes a waveform distorted from the rectangular wave by an undershoot voltage (e.g., spike-shaped voltage) being generated when the voltage transitions from the discrete voltage having a relatively high voltage level to the discrete voltage having a relatively low voltage level. The distortion of the waveform of the output voltage of the supply modulator 30 as described above causes noise. The amplitude of the spike-shaped voltage increases as the absolute value of a voltage change rate (dV/dt) increases.

(2.7) Band Select Switch Circuit

As illustrated in FIG. 6, the band select switch circuit 50 includes a common terminal 150, a plurality (four in the example of FIG. 6) of switches S81 to S84, and a plurality (four in the example of FIG. 6) of selection terminals 151 to 154, and a control terminal 155.

The common terminal 150 of the band select switch circuit 50 is connected to the output terminal 130 of the supply modulator 30. For example, a plurality of power amplifiers corresponding to communication bands that are different from each other are connected to the plurality of selection terminals 151 to 154, respectively. In the example illustrated in FIG. 6, the power amplifier 2 is connected to one selection terminal 151 among the plurality of selection terminals 151 to 154 through the filter circuit 40.

The control terminal 155 is an input terminal of a control signal Sg4. That is, the control terminal 155 is a terminal for receiving the control signal Sg4 indicating one of a plurality of communication bands. The band select switch circuit 50 controls on/off of the plurality of switches S81 to S84 such that the power amplifier corresponding to the communication band indicated by the control signal Sg4 is connected to the supply modulator 30.

The switch S81 is connected between the common terminal 150 and the selection terminal 151. Specifically, the switch S81 has a first terminal that is connected to the common terminal 150 and a second terminal that is connected to the selection terminal 151. In the above connection configuration, the switch S81 performs switching between the connection and the disconnection between the common terminal 150 and the selection terminal 151 by performing switching between on and off.

The switch S82 is connected between the common terminal 150 and the selection terminal 152. Specifically, the switch S82 has a first terminal that is connected to the common terminal 150 and a second terminal that is connected to the selection terminal 152. In the above connection configuration, the switch S82 performs switching between the connection and the disconnection between the common terminal 150 and the selection terminal 152 by performing switching between on and off.

The switch S83 is connected between the common terminal 150 and the selection terminal 153. Specifically, the switch S83 has a first terminal that is connected to the common terminal 150 and a second terminal that is connected to the selection terminal 153. In the above connection configuration, the switch S83 performs switching between the connection and the disconnection between the common terminal 150 and the selection terminal 153 by performing switching between on and off.

The switch S84 is connected between the common terminal 150 and the selection terminal 154. Specifically, the switch S84 has a first terminal that is connected to the common terminal 150 and a second terminal that is connected to the selection terminal 154. In the above connection configuration, the switch S84 performs switching between the connection and the disconnection between the common terminal 150 and the selection terminal 154 by performing switching between on and off.

In the example in FIG. 6, the plurality of switches S81 to S84 are controlled to be exclusively turned on. That is, only any one of the switches S81 to S84 is turned on, and the rest of the switches S81 to S84 are turned off.

(2.8) Filter Circuit

As illustrated in FIG. 6, the filter circuit 40 includes an input terminal 141, an output terminal 142, a plurality of inductors, and one or more capacitors. The plurality of inductors includes two inductors L0 and L1. The one or more capacitors include a capacitor C1.

The input terminal 141 is configured as an input terminal of a voltage selected by the supply modulator 30. That is, the input terminal 141 is a terminal for receiving the voltage selected from the plurality of voltages V1 to V4 according to the exemplary aspect. In the example of FIG. 6, the input terminal 141 is connected to the output terminal 130 of the supply modulator 30 through the band select switch circuit 50.

The output terminal 142 is a terminal from which the voltage filtered by the filter circuit 40 is output. The voltage output from the output terminal 142 of the filter circuit 40 is the power supply voltage Vcc supplied to the power amplifier 2.

The inductor L0 is connected between the input terminal 141 and the output terminal 142. More specifically, one end (e.g., the first end) of the inductor L0 is connected to the input terminal 141, and the other end (e.g., the second end) of the inductor L0 is connected to the output terminal 142.

The inductor L1 and the capacitor C1 are connected in series between the other end (e.g., the second end) of the inductor L0 and the ground. More specifically, one end (e.g., the first end) of the inductor L1 is connected to the other end (e.g., the second end) of the inductor L0, the other end (e.g., the second end) of the inductor L1 is connected to one of two electrodes of the capacitor C1, and the other of the two electrodes of the capacitor C1 is connected to the ground. That is, the filter circuit 40 includes an LC series circuit 41 (see FIG. 1) including the inductor L1 and the capacitor C1.

The filter circuit 40 configures a low pass filter. Thus, the filter circuit 40 can reduce a radio frequency component included in the power supply voltage Vcc. For example, when a predetermined band is a frequency band for Frequency Division Duplex (FDD), the filter circuit 40 is configured to reduce a component of a downlink operation band of the predetermined band.

The filter characteristics of the filter circuit 40 have one attenuation pole. The frequency of the attenuation pole is determined by the circuit constant of each of the inductor L1 and the capacitor C1 in the LC series circuit.

The filter circuit 40 is configured to reduce the amplitude of a spike-shaped voltage of the output voltage output from the supply modulator 30. That is, the power supply circuit 1 includes the filter circuit 40, and thus reduces the waveform distortion of the output voltage output from the supply modulator 30. Thus, a radio frequency component of the output voltage can be reduced. As a result, in the power supply circuit 1, noise included in the power supply voltage Vcc can be reduced, and thus it is possible to reduce noise that enters the power amplifier 2 from the power supply circuit 1.

More specifically, there is a case where noise in the power supply voltage Vcc may cause noise in the transmission signal output from the power amplifier 2. For example, when the power supply voltage Vcc includes radio frequency noise, there is a case where, in the power amplifier 2, noise having a frequency of a value obtained by adding the frequency of the transmission signal and the frequency of the radio frequency noise is generated. Therefore, there is a probability that a portion of such noise is generated in an uplink operation band or a downlink operation band of the predetermined band. Alternatively, there is a probability that a portion of such noise is included in unwanted emission (Spurious Emission) at a frequency outside a communication band (OOB: out of band). Therefore, it is possible to reduce the noise because the filter circuit 40 reduces the noise included in the power supply voltage Vcc.

(2.9) Digital Control Circuit

Figure 7:
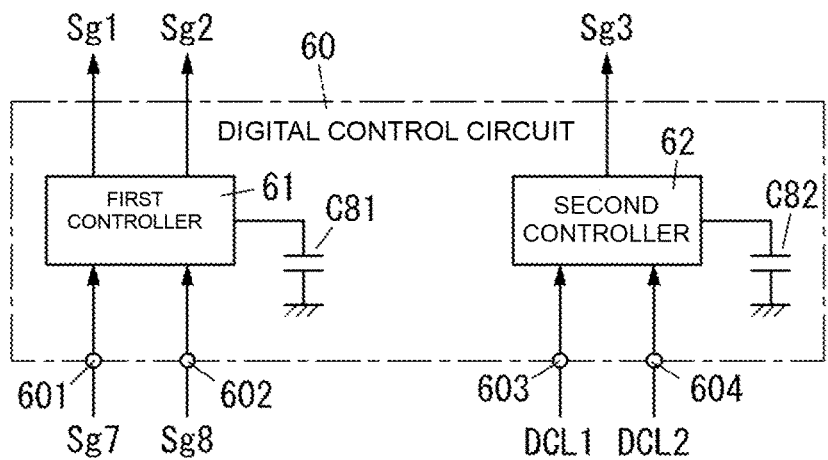
FIG. 7 is a circuit configuration diagram of a digital control circuit in the power supply circuit according to Embodiment 1.

As illustrated in FIG. 7, the digital control circuit 60 includes a first controller 61, a second controller 62, two capacitors C81 and C82, and four control terminals 601 to 604. The four control terminals 601 to 604 of the digital control circuit 60 are connected to the four second control terminals T5 (see FIG. 4) provided in the radio frequency system 200 in a one-to-one manner. Therefore, the four control terminals 601 to 604 of the digital control circuit 60 are connected to the RF signal processing circuit 51 (see FIG. 4) of the communication device 7.

The first controller 61 receives a source-synchronous digital control signal from the RF signal processing circuit 51 through the control terminals 601 and 602, and processes the digital control signal and generates the control signal Sg1 and the control signal Sg2.

In the first controller 61, one set of a clock signal Sg7 and a data signal Sg8 is used as the digital control signals for the pre-regulator circuit 10 and the switched-capacitor circuit 20. The clock signal Sg7 is input to the first controller 61 through the control terminal 601. The data signal Sg8 is input to the first controller 61 through the control terminal 602.

The second controller 62 is configured to process digitally controlled level (DCL) signals DCL1 and DCL2, which are digital control signals received from the RF signal processing circuit 51 through the control terminals 603 and 604, and generates the control signal Sg3. The digitally controlled level signals DCL1 and DCL2 correspond to envelope signals.

Each of the digitally controlled level signals DCL1 and DCL2 is a 1-bit signal. Each of the voltages V1 to V4 is represented by a combination of two 1-bit signals. For example, V1, V2, V3, and V4 are represented by "00", "01", "10", and "11", respectively. A Gray code may be used to express the voltage level. In the above case, two digitally controlled level signals are configured to control the supply modulator 30, but the number of digitally controlled level signals is not limited to two. For example, any number of digitally controlled level signals, one or three or more, may be used in accordance with the number of voltage levels that can be selected by the supply modulator 30. The digital control signal used to control the supply modulator 30 is not limited to the digitally controlled level signal.

The capacitor C81 is connected between the first controller 61 and the ground. For example, the capacitor C81 is connected between a power line for supplying power to the first controller 61 and the ground, and functions as a bypass capacitor. The capacitor C82 is connected between the second controller 62 and the ground. For example, the capacitor C82 is connected between a power line for supplying power to the second controller 62 and the ground, and functions as a bypass capacitor.

(3) Structure of Tracker Module

As illustrated in FIGS. 1 to 3, the tracker module 100 according to Embodiment 1 includes the module laminate 9, the IC chip 80, the plurality (ten in the example of FIG. 6) of capacitors C11 to C16 and C21 to C24 of the switched-capacitor circuit 20, the plurality (four in FIG. 6) of capacitors C61 to C64 of the pre-regulator circuit 10, and the plurality of external connection terminals 160. The tracker module 100 according to Embodiment 1 further includes a resin layer 94 and a shield electrode layer 95. The tracker module 100 according to Embodiment 1 has a circuit configuration in which the power inductor L71 is removed from the circuit configuration of the power supply circuit 1. That is, the tracker module 100 does not include the power inductor L71. In FIG. 2, the resin layer 94 and the shield electrode layer 95 are not illustrated.

(3.1) Module Laminate

As illustrated in FIGS. 2 and 3, the module laminate 9 has a first main surface 91 and a second main surface 92 that face each other in a thickness direction D0 of the module laminate 9. For purposes of this disclosure, the term "facing" means facing geometrically rather than physically. In a plan view in the thickness direction D0 of the module laminate 9, an outer edge of the module laminate 9 has, for example, a rectangular shape, but may have a shape other than a rectangular shape. The module laminate 9 is, for example, a multilayer laminate in which a plurality of dielectric layers and a plurality of conductive layers (not illustrated) are laminated. A material of each conductive layer is, for example, copper. The plurality of conductive layers includes a ground layer. The ground layer of the module laminate 9 is electrically connected to at least one external ground terminal included in the plurality of external connection terminals 160 through a via conductor or the like of the module laminate 9.

The module laminate 9 is, for example, a low temperature co-fired ceramics (LTCC) board. The module laminate 9 is not limited to the LTCC board, and may be, for example, a printed wiring board, a high temperature co-fired ceramics (HTCC) board, a resin multilayer laminate, or a component-embedded board.

(3.2) IC Chip

As illustrated in FIGS. 1 to 3, the IC chip 80 is disposed at the module laminate 9. For purposes of this disclosure, the phrase "the IC chip 80 is disposed at the module laminate 9" includes the meanings that the IC chip 80 is mechanically connected to the module laminate 9 and that the IC chip 80 is electrically connected to the module laminate 9. The IC chip 80 is disposed on the first main surface 91 of the module laminate 9. The IC chip 80 is, for example, a Si-based IC chip including a silicon board. The Si-based IC chip may include a silicon-on-insulator (SOI) board instead of a silicon board. The IC chip 80 is not limited to a Si-based IC chip, and may be, for example, a GaAs-based IC chip, a SiGe-based IC chip, or a GaN-based IC chip.

An outer edge 800 of the IC chip 80 has a rectangular shape in the plan view in the thickness direction D0 of the module laminate 9. The outer edge 800 of the IC chip 80 includes a first side 801, a second side 802, a third side 803, and a fourth side 804. The first side 801, the second side 802, the third side 803, and the fourth side 804 are arranged in the order of the first side 801, the second side 802, the third side 803, and the fourth side 804. At the outer edge 800, the first side 801 and the third side 803 are parallel to each other, and the second side 802 and the fourth side 804 are parallel to each other.

As illustrated in FIG. 2, the IC chip 80 includes a PR switch portion (first switch portion) 101, an SC switch portion (second switch portion) 102, an SC switch portion (third switch portion) 103, an SM switch portion (fourth switch portion) 104, a BS switch portion (fifth switch portion) 105, a digital control unit 106, and a plurality of input and output electrodes 81.

The PR switch portion 101 includes a plurality of switches S61 to S63, S71, and S72 (see FIG. 6) of the pre-regulator circuit 10. In the IC chip 80, the PR switch portion 101 is disposed along the first side 801.

The SC switch portion 102 includes a plurality of switches S11, S12, S21, S22, S31, S32, S41, and S42 (see FIG. 6) of the switched-capacitor circuit 20. Specifically, the SC switch portion 102 includes a series circuit in which the plurality of switches S12, S11, S22, S21, S32, S31, S42, and S41 are connected in this order. In the IC chip 80, the SC switch portion 102 is disposed along the second side 802.

The SC switch portion 103 includes a plurality of switches S13, S14, S23, S24, S33, S34, S43, and S44 (see FIG. 6) of the switched-capacitor circuit 20. Specifically, the SC switch portion 103 includes a series circuit in which the plurality of switches S14, S13, S24, S23, S34, S33, S44, and S43 are connected in this order. In the IC chip 80, the SC switch portion 103 is disposed along the third side 803.

The SM switch portion 104 includes a plurality of switches S51 to S54 (see FIG. 6) of the supply modulator 30. In the IC chip 80, the SC switch portion 102 and the SC switch portion 103 are disposed to be adjacent to the SM switch portion 104.

The BS switch portion 105 includes a plurality of switches S81 to S84 (see FIG. 6) included in the band select switch circuit 50. In the IC chip 80, the BS switch portion 105 is disposed to be adjacent to the SM switch portion 104. According to the exemplary aspect, the BS switch portion 105 being disposed adjacent to the SM switch portion 104 means that the BS switch portion 105 and the SM switch portion 104 are disposed without providing none of the PR switch portion 101, the SC switch portion 102, the SC switch portion 103, and the digital control unit 106 between the BS switch portion 105 and the SM switch portion 104, in the plan view of the IC chip 80.

The digital control unit 106 includes the first controller 61 and the second controller 62 (see FIG. 7) of the digital control circuit 60. The digital control unit 106 is disposed at the central portion of the IC chip 80 in the plan view in the thickness direction D0 of the module laminate 9, and is surrounded by the PR switch portion 101, the SC switch portion 102, the SM switch portion 104, and the BS switch portion 105.

In the IC chip 80, each of the plurality of switches S11 to S14, S21 to S24, S31 to S34, S41 to S44, S51 to S54, S61 to S63, S71, S72, and S81 to S84 is, for example, a metal oxide semiconductor field effect transistor (MOSFET).

(3.3) Plurality of Capacitors of Switched-Capacitor Circuit and Plurality of Capacitors of Pre-Regulator Circuit As illustrated in FIG. 6, a plurality (ten in the example of FIG. 6) of capacitors C11 to C16 and C21 to C24 of the switched-capacitor circuit 20 and a plurality (four in the example of FIG. 6) of capacitors C61 to C64 of the pre-regulator circuit 10 are disposed at the module laminate 9.

More specifically, the plurality of capacitors C11 to C16, C21 to C24, and the plurality of capacitors C61 to C64 are disposed on the first main surface 91 of the module laminate 9. Each of the plurality of capacitors C11 to C16, C21 to C24, and the plurality of capacitors C61 to C64 is a chip capacitor. That is, each of the plurality of capacitors C11 to C16, C21 to C24, and the plurality of capacitors C61 to C64 is a surface-mounted capacitor.

In the tracker module 100, in the plan view in the thickness direction D0 of the module laminate 9, the IC chip 80 and the capacitor C11 are adjacent to each other, the IC chip 80 and the capacitor C12 are adjacent to each other, the IC chip 80 and the capacitor C13 are adjacent to each other, the IC chip 80 and the capacitor C14 are adjacent to each other, the IC chip 80 and the capacitor C15 are adjacent to each other, and the IC chip 80 and the capacitor C16 are adjacent to each other. For purposes of this disclosure, the phrase "the IC chip 80 and the capacitor are adjacent to each other" means that the IC chip 80 and the capacitor are disposed on the first main surface 91 of the module laminate 9 with no other circuit component between the IC chip 80 and the capacitor in the plan view in the thickness direction D0 of the module laminate 9.

In the tracker module 100, the plurality of capacitors C11 to C16 and C21 to C24 of the switched-capacitor circuit 20 are disposed along the second side 802 or the third side 803 of the IC chip 80 in the plan view in the thickness direction D0 of the module laminate 9.

More specifically, in the tracker module 100, the capacitors C13, C16, and C21 are adjacent to the second side 802 of the IC chip 80 in the plan view in the thickness direction D0 of the module laminate 9. As described above, the capacitor C13 and the capacitor C16 are a pair of flying capacitors that are complementarily charged and discharged, and the capacitor C21 is a smoothing capacitor that smooths the voltage of each of the capacitors C13 and C16 and the voltage of the node N1. In the tracker module 100, the capacitor C21 is disposed between the capacitor C13 and the capacitor C16 in the plan view in the thickness direction D0 of the module laminate 9.

In the tracker module 100, the plurality of capacitors C61 to C64 are adjacent to the IC chip 80 in the plan view in the thickness direction D0 of the module laminate 9. The plurality of capacitors C61 to C64 of the pre-regulator circuit 10 are disposed along the first side 801 of the IC chip 80 in the plan view in the thickness direction D0 of the module laminate 9.

(3.4) Filter Circuit

In the tracker module 100 according to Embodiment 1, as illustrated in FIG. 2, the two inductors L0 and L1 and the one capacitor C1 included in the filter circuit 40 are disposed on the module laminate 9. More specifically, the two inductors L0 and L1 and the capacitor C1 are disposed on the first main surface 91 of the module laminate 9. Each of the two inductors L0 and L1 is a chip inductor. That is, each of the two inductors L0 and L1 is a surface-mounted inductor. Further, one capacitor C1 is a chip capacitor. That is, the one capacitor C1 is a surface-mounted capacitor.

The inductor L0 included in the filter circuit 40 is adjacent to the IC chip 80 in the plan view in the thickness direction D0 of the module laminate 9. The inductor L0 included in the filter circuit 40 is adjacent to the BS switch portion 105 of the IC chip 80 in the plan view in the thickness direction D0 of the module laminate 9. That is, the inductor L0 included in the filter circuit 40 is adjacent to the switches S81 to S84 included in the band select switch circuit 50 of the IC chip 80 in the plan view in the thickness direction D0 of the module laminate 9.

In addition, the two inductors L0 and L1 of the filter circuit 40 are adjacent to each other in the plan view in the thickness direction D0 of the module laminate 9. As a result, it is possible to reduce the size of the module laminate 9 as compared to a case where the inductors L0 and L1 are not adjacent to each other in the plan view in the thickness direction of the module laminate 9. That is, it is possible to reduce the size of the tracker module 100. A magnetic flux direction of the inductor L0 and a magnetic flux direction of the inductor L1 are perpendicular to each other. For purposes of this disclosure, the phrase "magnetic flux direction of the inductor" means an extending direction of a winding axis of the inductor. Accordingly, the phrase that "the magnetic flux direction of the inductor L0 and the magnetic flux direction of the inductor L1 are perpendicular to each other" means that an absolute value of a difference between 90° and an angle formed between an extending direction of the winding axis of the inductor L0 and an extending direction of the winding axis of the inductor L1 is equal to or smaller than 20°. Thus, magnetic coupling between the inductor L0 and the inductor L1 can be reduced, and a change in the circuit constant of the inductor L1 due to the magnetic coupling between the inductor L0 and the inductor L1 can also be reduced. Therefore, a change in the frequency of the attenuation pole of the filter circuit 40 can be reduced, and the deterioration in the filter characteristics of the filter circuit 40 can also be reduced.

More specifically, the inductor L0 and the inductor L1 have a rectangular shape in the plan view in the thickness direction D0 of the module laminate 9. The extending direction of the winding axis of the inductor L0 is parallel to the longitudinal direction of the inductor L0. The extending direction of the winding axis of the inductor L1 is parallel to the longitudinal direction of the inductor L1. The longitudinal direction of the inductor L0 and the longitudinal direction of the inductor L1 are perpendicular to each other. For purposes of this disclosure, the phrase "the longitudinal direction of the inductor L0 and the longitudinal direction of the inductor L1 are perpendicular to each other" means the absolute value of the difference between 90° and an angle formed by the longitudinal direction of the inductor L0 and the longitudinal direction of the inductor L1 is equal to or smaller than 20°. Also, in an exemplary aspect, the longitudinal direction corresponds to a direction extending parallel to the respective longer sides of the rectangular shape of each of inductors L0 and L1.

(3.5) Input and Output Electrode

As illustrated in FIG. 3, the plurality of input and output electrodes 81 are electrically connected to circuit components other than the IC chip 80, which are disposed on the first main surface 91 of the module laminate 9, the plurality of external connection terminals 160 disposed on the second main surface 92 of the module laminate 9, or the like through wiring portions, via conductor portions, or the like formed at the module laminate 9.

(3.6) External Connection Terminal

The plurality of external connection terminals 160 illustrated in FIG. 3 include an input terminal 161 (see FIG. 4), a plurality (four) of input control terminals 165 (only one is illustrated in FIG. 4), an output terminal 164 (see FIG. 4), and a ground terminal (not illustrated). The input terminal 161 is connected to the input terminal 110 of the pre-regulator circuit 10. The input terminal 161 is a terminal connected to the DC power source 70 through the power source connection terminal T4 provided in the radio frequency system 200. That is, the input terminal 110 of the pre-regulator circuit 10 is connected to the DC power source 70 through the input terminal 161. The four input control terminals 165 are terminals connected to the four second control terminals T5. The four input control terminals 165 are connected to the control terminals 601 to 604 of the digital control circuit 60. The output terminal 164 is connected to the output terminal 142 of the filter circuit 40. The output terminal 164 is a terminal to which the power supply voltage Vcc is output, and is connected to the power supply terminal of the power amplifier 2. The plurality of ground terminals are terminals to which a ground potential is applied.

(3.7) Resin Layer

As illustrated in FIG. 3, a resin layer 94 is disposed on the first main surface 91 of the module laminate 9, and covers a portion of each of the plurality of circuit components included in the tracker module 100 and the first main surface 91 of the module laminate 9. The plurality of circuit components includes the IC chip 80, the plurality of capacitors C11 to C16, the plurality of capacitors C21 to C24, and the plurality of capacitors C61 to C64. The resin layer 94 contains resin (for example, epoxy resin). The resin layer 94 may contain a filler in addition to the resin. The resin layer 94 is electrically insulating.

(3.8) Shield Electrode Layer

As illustrated in FIG. 3, the shield electrode layer 95 covers the resin layer 94 and the module laminate 9. More specifically, the shield electrode layer 95 covers a main surface 941 and an outer peripheral surface 943 of the resin layer 94 and an outer peripheral surface 93 of the module laminate 9.

The shield electrode layer 95 has conductivity. In the tracker module 100, the shield electrode layer 95 is a shield layer provided for the purpose of electromagnetic shielding the inside and the outside of the tracker module 100. The shield electrode layer 95 is in contact with at least a portion of an outer peripheral surface of the ground layer provided in the module laminate 9. Therefore, it is possible to set the potential of the shield electrode layer 95 to be equal to the potential of the ground layer. Although the shield electrode layer 95 has a multilayer structure in which a plurality of metal layers is laminated, the shield electrode layer 95 is not limited to the multilayer structure, and may be one metal layer. The metal layer contains one type or a plurality of types of metals.

(3.9) Disposition of Tracker Module

The tracker module 100 is disposed, for example, at a motherboard provided in the radio frequency system 200. More specifically, the tracker module 100 is electrically and mechanically connected to the motherboard by the plurality of external connection terminals 160. Thus, in the radio frequency system 200, for example, the output terminal of the tracker module 100 (output terminal 142 of the filter circuit 40) is connected to the power supply terminal of the power amplifier 2 disposed at the motherboard.

(4) Structure of Radio Frequency System

The radio frequency system 200 includes a motherboard (not illustrated) and a plurality of electronic components disposed on the motherboard. The motherboard is, for example, a printed wiring board. The plurality of electronic components includes the tracker module 100, the power inductor L71, the power amplifier 2, and the filter 3.

(5) Configuration of Communication Device

The communication device 7 includes the radio frequency system 200, the signal processing circuit 5 disposed at the motherboard of the radio frequency system 200, and the antenna 6. The communication device 7 may include a second motherboard at which the radio frequency system 200 and the signal processing circuit 5 are disposed, separately from the first motherboard which is the motherboard of the radio frequency system 200.

(6) Effects

As described above, the tracker module 100 according to Embodiment 1 includes the module laminate 9, the IC chip 80, and the filter circuit 40. The IC chip 80 is disposed at the module laminate 9. The filter circuit 40 includes the plurality of inductors L0 and L1. The IC chip 80 includes the switches S11 to S44 included in the switched-capacitor circuit 20 and the switches S51 to S54 included in the supply modulator 30. Moreover, the switched-capacitor circuit 20 is configured to generate a plurality of discrete voltages based on the input voltage. The supply modulator 30 is configured to selectively output at least one of the plurality of discrete voltages to the filter circuit 40. The plurality of inductors includes the inductor L0 and the inductor L1. The inductor L0 is disposed at the module laminate 9. The inductor L1 is connected to the inductor L0. The inductor L0 and the inductor L1 are adjacent to each other. The magnetic flux direction of the inductor L0 and the magnetic flux direction of the inductor L1 are perpendicular to each other. As a result, the size of the tracker module 100 can be reduced as compared to a case where the inductor L0 and the inductor L1 are not adjacent to each other. In addition, it is possible to reduce magnetic coupling between the inductor L0 and the inductor L1, and to reduce a change in the circuit constant of the inductor L1 due to the magnetic coupling between the inductor L0 and the inductor L1. Thus, it is possible to reduce the change in the frequency of the attenuation pole of the filter circuit 40. Therefore, even though the tracker module 100 is reduced in size by causing the inductor L0 and the inductor L1 to be adjacent to each other, the deterioration in the filter characteristics of the filter circuit 40 can be reduced. More specifically, in the power amplifier 2, it is possible to reduce noise in the communication band or noise (e.g., spurious) outside the communication band due to the noise included in the power supply voltage Vcc.

In the tracker module 100 according to Embodiment 1, the inductor L0 and the inductor L1 have a rectangular shape in the plan view in the thickness direction D0 of the module laminate 9. In the plan view in the thickness direction D0 of the module laminate 9, the longitudinal direction of the inductor L0 and the longitudinal direction of the inductor L1 are perpendicular to each other. Thus, it is possible to reduce magnetic coupling between the inductor L0 and the inductor L1, and to reduce a change in the circuit constant of the inductor L1 due to the magnetic coupling between the inductor L0 and the inductor L1.

In the tracker module 100 according to Embodiment 1, the inductor L0 is adjacent to the IC chip 80 in the plan view in the thickness direction D0 of the module laminate 9. Thus, the length of the wiring connected to the first inductor L0 in the filter circuit 40 can be shortened, so that the noise immunity of the filter circuit 40 can be improved.

In the tracker module 100 according to Embodiment 1, the first inductor L0 is adjacent to the switches S81 to S84 included in the band select switch circuit included in the IC chip 80, in the plan view in the thickness direction D0 of the module laminate 9. Thus, the length of the wiring connected to the first inductor L0 in the filter circuit 40 can be shortened, so that the noise immunity of the filter circuit 40 can be improved.

Embodiment 2

Figure 8:
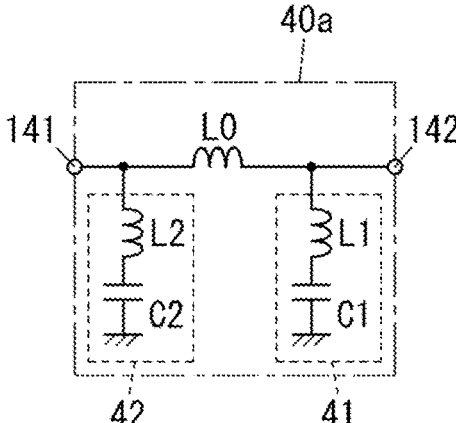
FIG. 8 is a circuit diagram of a filter circuit in a tracker module according to Embodiment 2.

A tracker module 100 according to Embodiment 2 includes a filter circuit 40a as illustrated in FIG. 8.

As illustrated in FIG. 8, the filter circuit 40a includes an input terminal 141, an output terminal 142, a plurality of inductors, and one or more capacitors. The plurality of inductors includes three inductors L0, L1, and L2. The one or more capacitors include two capacitors C1 and C2.

The inductor L0 is connected between the input terminal 141 and the output terminal 142. More specifically, one end (e.g., the first end) of the inductor L0 is connected to an IC chip 80 (see FIG. 9) including a band select switch circuit 50 (see FIG. 6) through the input terminal 141, and the other end (e.g., the second end) of the inductor L0 is connected to an output terminal 164 (see FIG. 6) through the output terminal 142.

The inductor L1 and the capacitor C1 are connected in series between the other end (e.g., the second end) of the inductor L0 and the ground. More specifically, one end (e.g., the first end) of the inductor L1 is connected to the other end (e.g., the second end) of the inductor L0, the other end (e.g., the second end) of the inductor L1 is connected to one of two electrodes of the capacitor C1, and the other of the two electrodes of the capacitor C1 is connected to the ground. That is, the filter circuit 40a includes an LC series circuit 41 including the inductor L1 and the capacitor C1.

The inductor L2 and the capacitor C2 are connected in series between the one end (e.g., the first end) of the inductor L0 and the ground. More specifically, one end (e.g., the first end) of the inductor L2 is connected to the one end (e.g., the first end) of the inductor L0, the other end (e.g., the second end) of the inductor L2 is connected to one of two electrodes of the capacitor C2, and the other of the two electrodes of the capacitor C2 is connected to the ground. That is, the filter circuit 40a includes an LC series circuit 42 including the inductor L2 and the capacitor C2.

The filter characteristics of the filter circuit 40a have two attenuation poles. The frequency of one of the two attenuation poles is determined by the circuit constant of each of the inductor L1 and the capacitor C1 in the LC series circuit 41. The frequency of the other attenuation pole of the two attenuation poles is determined by the circuit constant of each of the inductor L2 and the capacitor C2 in the LC series circuit 42.

Figure 9:
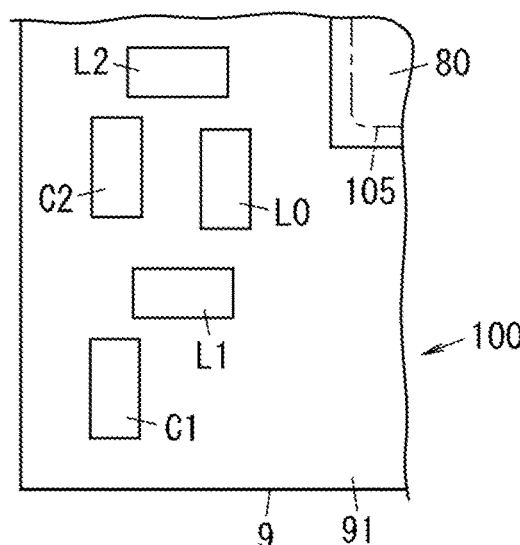
FIG. 9 is a partial plan view of the tracker module according to Embodiment 2.

In the tracker module 100 according to Embodiment 2, as illustrated in FIG. 9, the three inductors L0, L1, and L2 and the two capacitors C1 and C2 included in the filter circuit 40a are disposed at a module laminate 9. More specifically, the three inductors L0, L1, and L2 and the two capacitors C1 and C2 are disposed on the first main surface 91 of the module laminate 9. Each of the three inductors L0, L1, and L2 is a chip inductor. That is, each of the three inductors L0, L1, and L2 is a surface-mounted inductor. Further, the two capacitors C1 and C2 are chip capacitors. That is, the two capacitors C1 and C2 are surface-mounted capacitors.

The inductors L0 and L2 included in the filter circuit 40a are adjacent to the IC chip 80 in the plan view in a thickness direction D0 of the module laminate 9. The two inductors L0 and L2 included in the filter circuit 40a are adjacent to a BS switch portion 105 of the IC chip 80 in the plan view in the thickness direction D0 of the module laminate 9.

The two inductors L0 and L1 of the filter circuit 40a are adjacent to each other in the plan view in the thickness direction D0 of the module laminate 9. A magnetic flux direction of the inductor L0 and a magnetic flux direction of the inductor L1 are perpendicular to each other. In the plan view in the thickness direction D0 of the module laminate 9, the inductors L0 and L1 have a rectangular shape, and a longitudinal direction of the inductor L0 and a longitudinal direction of the inductor L1 are perpendicular to each other.

The two inductors L0 and L2 of the filter circuit 40a are adjacent to each other in the plan view in the thickness direction D0 of the module laminate 9. The magnetic flux direction of the inductor L0 and a magnetic flux direction of the inductor L2 are perpendicular to each other. In the plan view in the thickness direction D0 of the module laminate 9, the inductor L2 has a rectangular shape, and the longitudinal direction of the inductor L0 and a longitudinal direction of the inductor L2 are perpendicular to each other.

The two inductors L1 and L2 of the filter circuit 40a are not adjacent to each other in the plan view in the thickness direction D0 of the module laminate 9. More specifically, the inductor L0 and the capacitor C2 are located between the inductor L1 and the inductor L2.

As a result, in the tracker module 100 according to Embodiment 2, magnetic coupling between the inductor L0, and the inductors L1 and L2 is less likely to occur. Magnetic coupling between the inductor L1 and the inductor L2 is also less likely to occur. Thus, in the tracker module 100 according to Embodiment 2, the filter characteristics are less likely to deteriorate in the filter circuit 40a.

In the tracker module 100 according to Embodiment 2, in the plan view in the thickness direction of the module laminate 9, the inductors L0 and L1 are adjacent to each other, and the inductors L0 and L2 are adjacent to each other. Thus, the size of the tracker module 100 can be reduced as compared to a case where the inductor L0 is adjacent to neither the inductor L1 nor the inductor L2 in the plan view in the thickness direction of the module laminate 9.

In the tracker module 100 according to Embodiment 2, the inductor L0 has a first end that is connected to the IC chip 80 and a second end that is connected to the output terminal 164 (see FIG. 4). The inductor L2 has a third end (e.g., the first end) that is connected to the first end of the inductor L0 and a fourth end (e.g., the second end) that is connected to the ground. As a result, magnetic coupling is less likely to occur between the inductor L2 and the inductor L0. Thus, in the tracker module 100 according to Embodiment 2, the change in the circuit constant of the inductor L2 due to the magnetic coupling can be reduced, so that it is possible to reduce the change in the frequency of the attenuation pole of the filter circuit 40a. That is, in the tracker module 100 according to Embodiment 2, the change in one of the two attenuation poles in the filter characteristics of the filter circuit 40a can be reduced.

In addition, in the tracker module 100 according to Embodiment 2, the inductor L0 has the first end that is connected to the IC chip 80 and the second end that is connected to the output terminal 164. The second inductor L1 has a third end (e.g., the first end) that is connected to the second end of the inductor L0 and a fourth end (e.g., the second end) that is connected to the ground. As a result, magnetic coupling is less likely to occur between the inductor L1 and the inductor L0. Thus, in the tracker module 100 according to Embodiment 2, the change in the circuit constant of the inductor L1 due to the magnetic coupling can be reduced, so that it is possible to reduce the change in the frequency of the attenuation pole of the filter circuit 40a. That is, in the tracker module 100 according to Embodiment 2, the change in one of the two attenuation poles in the filter characteristics of the filter circuit 40a can be reduced.

Embodiment 3

Figure 10:
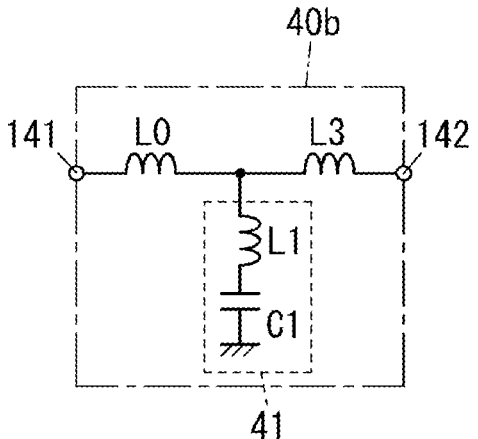
FIG. 10 is a circuit diagram of a filter circuit in a tracker module according to Embodiment 3.

A tracker module 100 according to Embodiment 3 includes a filter circuit 40b as illustrated in FIG. 10.

As illustrated in FIG. 10, the filter circuit 40b includes an input terminal 141, an output terminal 142, a plurality of inductors, and one or more capacitors. The plurality of inductors includes three inductors L0, L1, and L3. The one or more capacitors include a capacitor C1.

The inductors L0 and L3 are connected between the input terminal 141 and the output terminal 142. More specifically, one end (e.g., the first end) of the inductor L0 is connected to the input terminal 141, and the other end (e.g., the second end) of the inductor L0 is connected to one end (e.g., the first end) of the inductor L3. The other end (e.g., the second end) of the inductor L3 is connected to the output terminal 142.

The inductor L1 and the capacitor CI are connected in series between the other end (e.g., the second end) of the inductor L0 and the ground. More specifically, one end (e.g., the first end) of the inductor L1 is connected to the other end (e.g., the second end) of the inductor L0, the other end (e.g., the second end) of the inductor L1 is connected to one of two electrodes of the capacitor C1, and the other of the two electrodes of the capacitor C1 is connected to the ground. That is, the filter circuit 40b includes an LC series circuit 41 including the inductor L1 and the capacitor C1.

The filter characteristics of the filter circuit 40b have one attenuation pole. The frequency of the attenuation pole is determined by the circuit constant of each of the inductor L1 and the capacitor C1 and the circuit constant of the inductor L3 in the LC series circuit.

Figure 11:
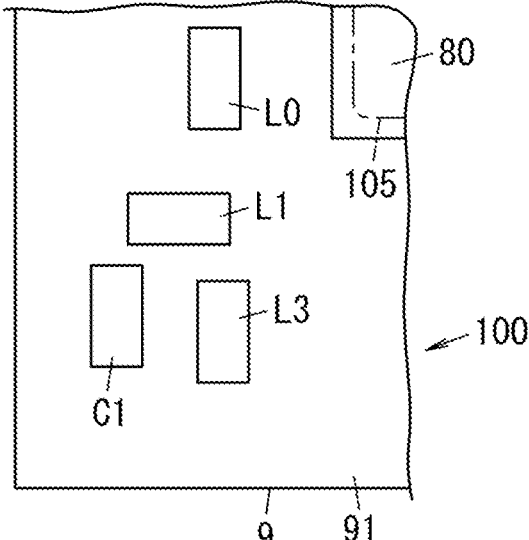
FIG. 11 is a partial plan view of the tracker module according to Embodiment 3.

In the tracker module 100 according to Embodiment 3, as illustrated in FIG. 11, the three inductors L0, L1, and L3 and the one capacitor C1 included in the filter circuit 40b are disposed at a module laminate 9. More specifically, the three inductors L0, L1, and L3 and the capacitor C1 are disposed on a first main surface 91 of the module laminate 9. Each of the three inductors L0, L1, and L3 is a chip inductor. That is, each of the three inductors L0, L1, and L3 is a surface-mounted inductor. The capacitor C1 is a chip capacitor. That is, the capacitor C1 is a surface-mounted capacitor.

The inductor L0 included in the filter circuit 40b is adjacent to the IC chip 80 in the plan view in a thickness direction D0 of the module laminate 9. The inductor L0 included in the filter circuit 40b is adjacent to a BS switch portion 105 of the IC chip 80 in the plan view in the thickness direction D0 of the module laminate 9.

The two inductors L0 and L1 of the filter circuit 40b are adjacent to each other in the plan view in the thickness direction D0 of the module laminate 9. A magnetic flux direction of the inductor L0 and a magnetic flux direction of the inductor L1 are perpendicular to each other. In the plan view in the thickness direction D0 of the module laminate 9, the inductors L0 and L1 have a rectangular shape, and a longitudinal direction of the inductor L0 and a longitudinal direction of the inductor L1 are perpendicular to each other.

The two inductors L1 and L3 of the filter circuit 40b are adjacent to each other in the plan view in the thickness direction D0 of the module laminate 9. The magnetic flux direction of the inductor L1 and a magnetic flux direction of the inductor L3 are perpendicular to each other. In the plan view in the thickness direction D0 of the module laminate 9, the inductor L3 has a rectangular shape, and the longitudinal direction of the inductor L1 and a longitudinal direction of the inductor L3 are perpendicular to each other.

The two inductors L0 and L3 of the filter circuit 40b are not adjacent to each other in the plan view in the thickness direction D0 of the module laminate 9. More specifically, the inductor L1 is located between the inductor L0 and the inductor L3.

As a result, in the tracker module 100 according to Embodiment 3, magnetic coupling between the inductor L1, and the inductors L0 and L3 is less likely to occur. Magnetic coupling between the inductor L0 and the inductor L3 is also less likely to occur. Thus, in the tracker module 100 according to Embodiment 3, the filter characteristics is less likely to deteriorate in the filter circuit 40b.

In the tracker module 100 according to Embodiment 3, in the plan view in the thickness direction of the module laminate 9, the inductors L0 and L1 are adjacent to each other, and the inductors L1 and L3 are adjacent to each other. Thus, the size of the tracker module 100 can be reduced as compared to a case where the inductor L1 is adjacent to neither the inductor L0 nor the inductor L3 in the plan view in the thickness direction of the module laminate 9.

In addition, in the tracker module 100 according to Embodiment 3, the inductor L0 has the first end that is connected to the IC chip 80 and the second end that is connected to the output terminal 164. The second inductor L1 has a third end (e.g., the first end) that is connected to the second end of the inductor L0 and a fourth end (e.g., the second end) that is connected to the ground. As a result, magnetic coupling is less likely to occur between the inductor L1 and the inductor L0. Thus, in the tracker module 100 according to Embodiment 3, the change in the circuit constant of the inductor L1 due to the magnetic coupling can be reduced, so that it is possible to reduce the change in the frequency of the attenuation pole of the filter circuit 40b. That is, in the tracker module 100 according to Embodiment 3, the change in the attenuation pole in the filter characteristics of the filter circuit 40b can be reduced.

Embodiment 4

Figure 12:
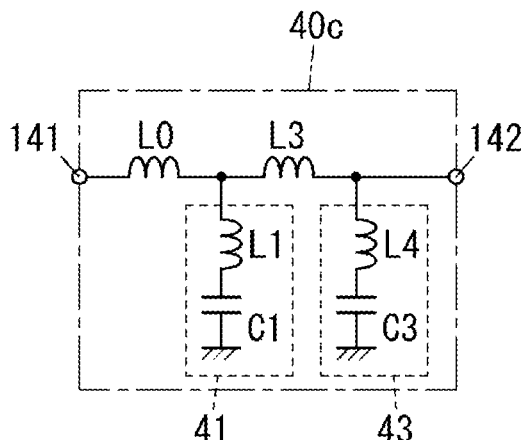
FIG. 12 is a circuit diagram of a filter circuit in a tracker module according to Embodiment 4.

A tracker module 100 according to Embodiment 4 includes a filter circuit 40c as illustrated in FIG. 12.

As illustrated in FIG. 12, the filter circuit 40c includes an input terminal 141, an output terminal 142, a plurality of inductors, and one or more capacitors. The plurality of inductors includes four inductors L0, L1, L3, and L4. The one or more capacitors include two capacitors C1 and C3.

The inductors L0 and L3 are connected between the input terminal 141 and the output terminal 142. More specifically, one end (e.g., the first end) of the inductor L0 is connected to the input terminal 141, and the other end (e.g., the second end) of the inductor L0 is connected to one end (e.g., the first end) of the inductor L3. The other end (e.g., the second end) of the inductor L3 is connected to the output terminal 142.

The inductor L1 and the capacitor C1 are connected in series between the other end (e.g., the second end) of the inductor L0 and the ground. More specifically, one end (e.g., the first end) of the inductor L1 is connected to the other end (e.g., the second end) of the inductor L0, the other end (e.g., the second end) of the inductor L1 is connected to one of two electrodes of the capacitor C1, and the other of the two electrodes of the capacitor C1 is connected to the ground. That is, the filter circuit 40c includes an LC series circuit 41 including the inductor L1 and the capacitor C1.

The inductor L4 and the capacitor C3 are connected in series between the other end (e.g., the second end) of the inductor L3 and the ground. More specifically, one end (e.g., the first end) of the inductor L4 is connected to the other end (e.g., the second end) of the inductor L3, the other end (e.g., the second end) of the inductor L4 is connected to one of two electrodes of the capacitor C3, and the other of the two electrodes of the capacitor C3 is connected to the ground.

That is, the filter circuit 40c includes an LC series circuit 43 including the inductor L4 and the capacitor C3.

The filter characteristics of the filter circuit 40c have two attenuation poles. The frequency of one attenuation pole of the two attenuation poles is determined by the circuit constant of each of the inductor L1 and the capacitor C1 in the LC series circuit. The frequency of the other attenuation pole of the two attenuation poles is determined by the circuit constant of each of the inductor L4 and the capacitor C3 in the LC series circuit.

Figure 13:
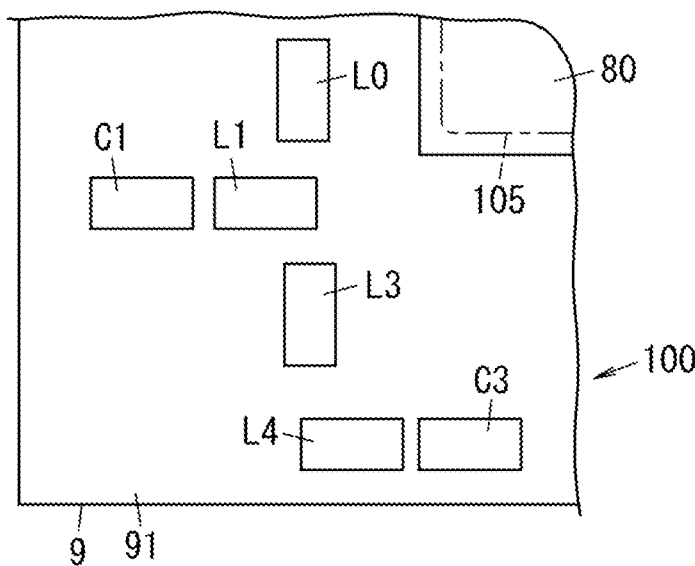
FIG. 13 is a partial plan view of the tracker module according to Embodiment 4.

In the tracker module 100 according to Embodiment 4, as illustrated in FIG. 13, the four inductors L0, L1, L3, and L4 and the two capacitors C1 and C3 included in the filter circuit 40c are disposed at a module laminate 9. More specifically, the four inductors L0, L1, L3, and L4 and the two capacitors C1 and C3 are disposed on a first main surface 91 of the module laminate 9. Each of the four inductors L0, L1, L3, and L4 is a chip inductor. That is, each of the four inductors L0, L1, L3, and L4 is a surface-mounted inductor. The two capacitors C1 and C3 are chip capacitors. That is, the two capacitors C1 and C3 are surface-mounted capacitors.

The inductors L0 and L1 included in the filter circuit 40c are adjacent to the IC chip 80 in the plan view in a thickness direction D0 of the module laminate 9. The inductor L0 included in the filter circuit 40c is adjacent to a BS switch portion 105 of the IC chip 80 in the plan view in the thickness direction D0 of the module laminate 9.

The two inductors L0 and L1 of the filter circuit 40c are adjacent to each other in the plan view in the thickness direction D0 of the module laminate 9. A magnetic flux direction of the inductor L0 and a magnetic flux direction of the inductor L1 are perpendicular to each other. In the plan view in the thickness direction D0 of the module laminate 9, the inductors L0 and L1 have a rectangular shape, and a longitudinal direction of the inductor L0 and a longitudinal direction of the inductor L1 are perpendicular to each other.

The two inductors L1 and L3 of the filter circuit 40c are adjacent to each other in the plan view in the thickness direction D0 of the module laminate 9. The magnetic flux direction of the inductor L1 and a magnetic flux direction of the inductor L3 are perpendicular to each other. In the plan view in the thickness direction D0 of the module laminate 9, the inductor L3 has a rectangular shape, and the longitudinal direction of the inductor L1 and a longitudinal direction of the inductor L3 are perpendicular to each other.

The two inductors L3 and L4 of the filter circuit 40c are adjacent to each other in the plan view in the thickness direction D0 of the module laminate 9. The magnetic flux direction of the inductor L3 and a magnetic flux direction of the inductor L4 are perpendicular to each other. In the plan view in the thickness direction D0 of the module laminate 9, the inductor L4 has a rectangular shape, and the longitudinal direction of the inductor L3 and a longitudinal direction of the inductor L4 are perpendicular to each other.

The inductor L0 of the filter circuit 40c is not adjacent to the inductors L3 and L4 in the plan view in the thickness direction D0 of the module laminate 9. More specifically, the inductor L1 is located between the inductor L0, and the inductors L3 and L4.

The two inductors L1 and L4 of the filter circuit 40c are not adjacent to each other in the plan view in the thickness direction D0 of the module laminate 9. More specifically, the inductor L3 is located between the inductor L1 and the inductor L4.

As a result, in the tracker module 100 according to Embodiment 4, magnetic coupling between the inductor L1, and the inductors L0 and L3 is less likely to occur. Magnetic coupling between the inductor L3 and the inductor L4 is also less likely to occur. Magnetic coupling is also less likely to occur between the inductor L0 and the inductor L3, between the inductor L0 and the inductor L4, and between the inductor L1 and the inductor L4. Thus, in the tracker module 100 according to Embodiment 4, the filter characteristics is less likely to deteriorate in the filter circuit 40c.

In the tracker module 100 according to Embodiment 4, in the plan view in the thickness direction of the module laminate 9, the inductors L0 and L1 are adjacent to each other, the inductors L1 and L3 are adjacent to each other, and the inductors L3 and L4 are adjacent to each other. Thus, the size of the tracker module 100 can be reduced as compared to a case where the inductors L1 and L3 are not adjacent to other inductors in the plan view in the thickness direction of the module laminate 9.

In the tracker module 100 according to Embodiment 4, the inductor L0 has the first end that is connected to the IC chip 80 and the second end that is connected to the output terminal 164. The inductor L1 has a third end (e.g., the first end) that is connected to the second end of the inductor L0 and a fourth end (e.g., the second end) that is connected to the ground. As a result, magnetic coupling is less likely to occur between the inductor L1 and the inductor L0. Thus, in the tracker module 100 according to Embodiment 4, the change in the circuit constant of the inductor L1 due to the magnetic coupling can be reduced, so that it is possible to reduce the change in the frequency of the attenuation pole of the filter circuit 40c.

In the tracker module 100 according to Embodiment 4, the inductor L3 has the first end that is connected to the IC chip 80 and the second end that is connected to the output terminal 164. The inductor L1 has the third end (e.g., the first end) that is connected to the first end of the inductor L3 and the fourth end (e.g., the second end) that is connected to the ground. As a result, magnetic coupling is less likely to occur between the inductor L1 and the inductor L3. Thus, in the tracker module 100 according to Embodiment 4, the change in the circuit constant of the inductor L1 due to the magnetic coupling can be reduced, so that it is possible to reduce the change in the frequency of the attenuation pole of the filter circuit 40c.

In addition, in the tracker module 100 according to Embodiment 4, the inductor L3 has the first end that is connected to the IC chip 80 and the second end that is connected to the output terminal 164. The inductor L4 has a third end (e.g., the first end) that is connected to the second end of the inductor L3 and a fourth end (e.g., the second end) that is connected to the ground. As a result, magnetic coupling is less likely to occur between the inductor L4 and the inductor L3. Thus, in the tracker module 100 according to Embodiment 4, the change in the circuit constant of the inductor L4 due to the magnetic coupling can be reduced, so that it is possible to reduce the change in the frequency of the attenuation pole of the filter circuit 40c.

Embodiment 5

A tracker module 100 according to Embodiment 5 includes a filter circuit 40a (see FIG. 8).

Figure 14:
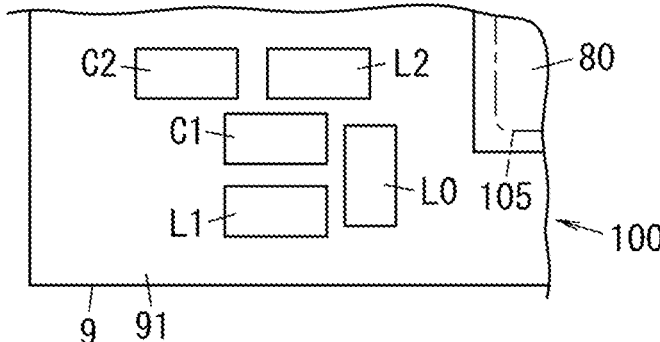
FIG. 14 is a partial plan view of a tracker module according to Embodiment 5.

In the tracker module 100 according to Embodiment 5, as illustrated in FIG. 14, the three inductors L0, L1, and L2 and the two capacitors C1 and C2 included in the filter circuit 40a are disposed at a module laminate 9. More specifically, the three inductors L0, L1, and L2 and the two capacitors C1 and C2 are disposed on the first main surface 91 of the module laminate 9. Each of the three inductors L0, L1, and L2 is a chip inductor. That is, each of the three inductors L0, L1, and L2 is a surface-mounted inductor. The two capacitors C1 and C2 are chip capacitors. That is, the two capacitors C1 and C2 are surface-mounted capacitors.

The inductors L0 and L2 included in the filter circuit 40a are adjacent to the IC chip 80 in the plan view in a thickness direction D0 of the module laminate 9. The three inductors L0 and L2 included in the filter circuit 40a are adjacent to a BS switch portion 105 of the IC chip 80 in the plan view in the thickness direction D0 of the module laminate 9.

The two inductors L0 and L1 of the filter circuit 40a are adjacent to each other in the plan view in the thickness direction D0 of the module laminate 9. A magnetic flux direction of the inductor L0 and a magnetic flux direction of the inductor L1 are perpendicular to each other. In the plan view in the thickness direction D0 of the module laminate 9, the inductors L0 and L1 have a rectangular shape, and a longitudinal direction of the inductor L0 and a longitudinal direction of the inductor L1 are perpendicular to each other.

According to the exemplary aspect, the two inductors L0 and L2 of the filter circuit 40a are adjacent to each other in the plan view in the thickness direction D0 of the module laminate 9. As a result, the magnetic flux direction of the inductor L0 and a magnetic flux direction of the inductor L2 are perpendicular to each other. In the plan view in the thickness direction D0 of the module laminate 9, the inductor L2 has a rectangular shape, and the longitudinal direction of the inductor L0 and a longitudinal direction of the inductor L2 are perpendicular to each other.

The two inductors L1 and L2 of the filter circuit 40a are not adjacent to each other in the plan view in the thickness direction D0 of the module laminate 9. More specifically, the capacitor C1 is located between the inductor L1 and the inductor L2.

As a result, in the tracker module 100 according to Embodiment 5, magnetic coupling between the inductor L0, and the inductors L1 and L2 is less likely to occur. Magnetic coupling between the inductor L1 and the inductor L2 is also less likely to occur. Thus, in the tracker module 100 according to Embodiment 5, the filter characteristics are less likely to deteriorate in the filter circuit 40a.

In the tracker module 100 according to Embodiment 5, in the plan view in the thickness direction of the module laminate 9, the inductors L0 and L1 are adjacent to each other, and the inductors L0 and L2 are adjacent to each other. Thus, the size of the tracker module 100 can be reduced as compared to a case where the inductor L0 is adjacent to neither the inductor L1 nor the inductor L2 in the plan view in the thickness direction of the module laminate 9.

In the tracker module 100 according to Embodiment 5, the first inductor L0 has the first end that is connected to the IC chip 80 and the second end that is connected to the output terminal 164. The second inductor L2 has a third end (e.g., the first end) that is connected to the first end of the first inductor L0 and a fourth end (e.g., the second end) that is connected to the ground. As a result, magnetic coupling is less likely to occur between the inductor L2 and the inductor L0. Thus, in the tracker module 100 according to Embodiment 5, the change in the circuit constant of the inductor L2 due to the magnetic coupling can be reduced, so that it is possible to reduce the change in the frequency of the attenuation pole of the filter circuit 40a. That is, in the tracker module 100 according to Embodiment 5, the change in one of the two attenuation poles in the filter characteristics of the filter circuit 40a can be reduced.

In the tracker module 100 according to Embodiment 5, the first inductor L0 has the first end that is connected to the IC chip 80 and the second end that is connected to the output terminal 164. The second inductor L1 has a third end (e.g., the first end) that is connected to the second end of the first inductor L0 and a fourth end (e.g., the second end) that is connected to the ground. As a result, magnetic coupling is less likely to occur between the inductor L1 and the inductor L0. Thus, in the tracker module 100 according to Embodiment 5, the change in the circuit constant of the inductor L1 due to the magnetic coupling can be reduced, so that it is possible to reduce the change in the frequency of the attenuation pole of the filter circuit 40*a*. That is, in the tracker module 100 according to Embodiment 5, the change in one of the two attenuation poles in the filter characteristics of the filter circuit 40*a* can be reduced.

Embodiment 6

Figure 15:
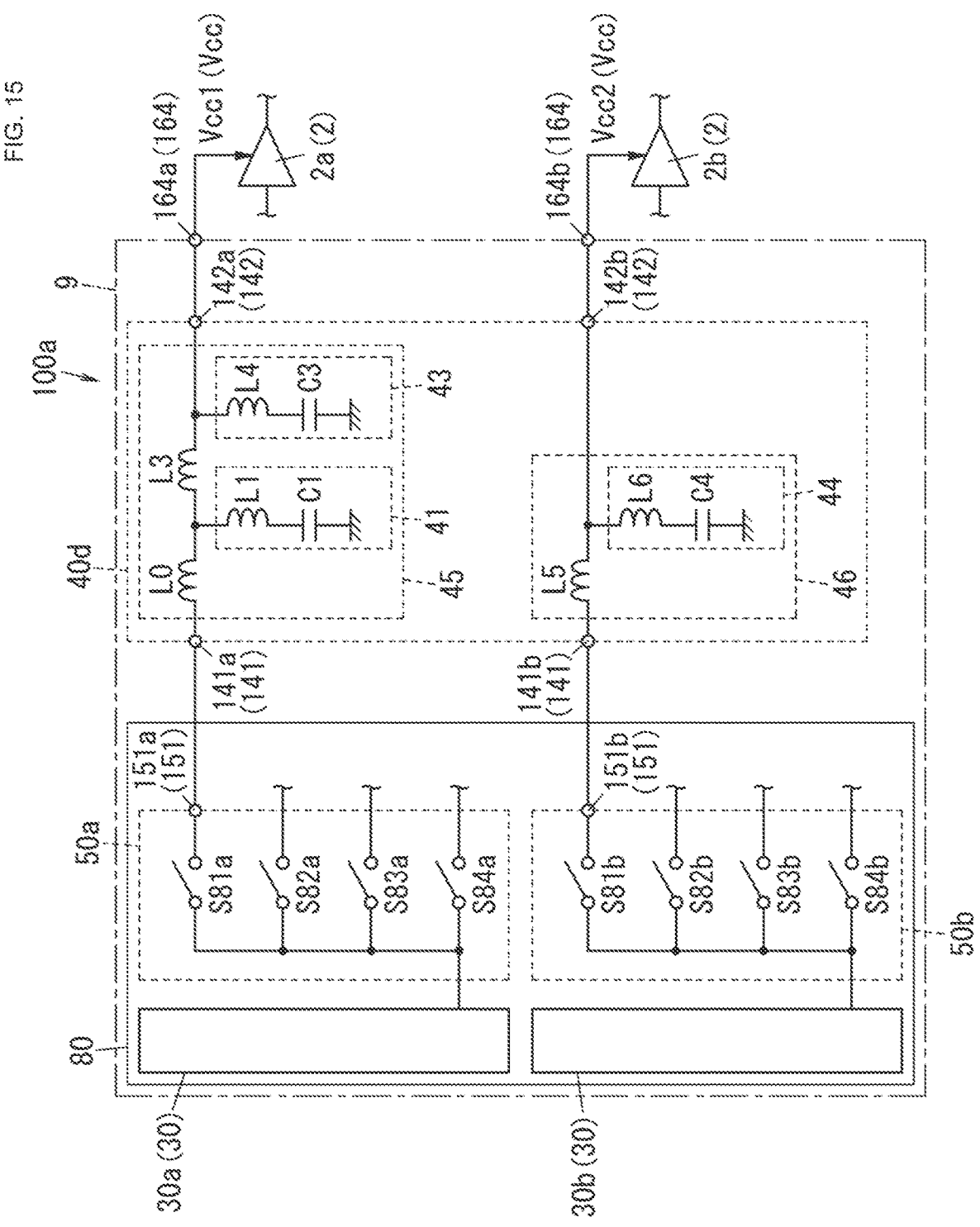
FIG. 15 is a circuit diagram of a tracker module according to Embodiment 6.
Figure 16:
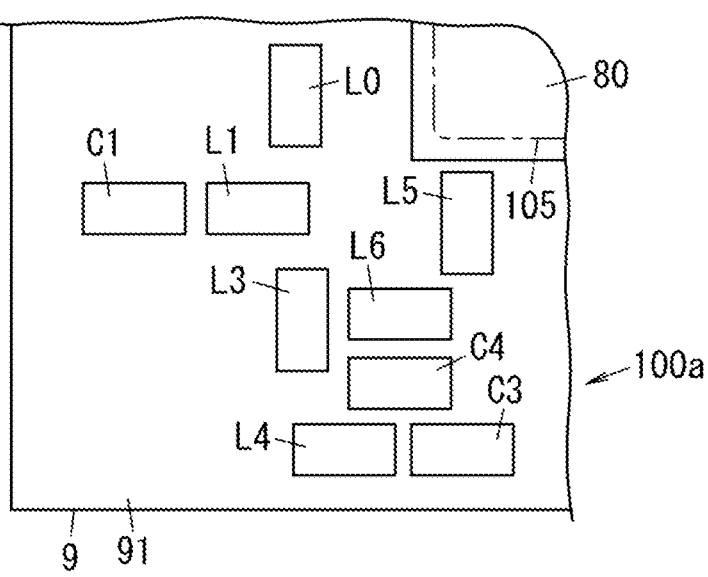
FIG. 16 is a partial plan view of the tracker module according to Embodiment 6.

As illustrated in FIG. 15, a tracker module 100*a* according to Embodiment 6 supplies a power supply voltage Vcc to a plurality (two in FIG. 15) of power amplifiers 2. More specifically, the tracker module 100*a* supplies a power supply voltage Vcc1 to the power amplifier 2*a*. Further, the tracker module 100*a* supplies a power supply voltage Vcc2 to the power amplifier 2*b*.

The tracker module 100*a* includes a plurality (two in FIG. 15) of supply modulators 30. More specifically, the tracker module 100*a* includes a supply modulator 30*a* corresponding to the power supply voltage Vcc1 and a supply modulator 30*b* corresponding to the power supply voltage Vcc2.

A filter circuit 40*d* includes a plurality of input terminals 141, a plurality of output terminals 142, a plurality of inductors, and one or more capacitors. The plurality of input terminals 141 include input terminals 141*a* and 141*b*. The plurality of output terminals 142 include output terminals 142*a* and 142*b*. The plurality of inductors includes six inductors L0, L1, and L3 to L6. The one or more capacitors include three capacitors C1, C3, and C4.

The input terminal 141*a* is connected to the supply modulator 30*a* through a selection terminal 151*a* of a band select switch circuit 50*a*.

The output terminal 142*a* is a terminal from which the voltage filtered by the filter circuit 40*d* is output. The voltage output from the output terminal 142*a* is the power supply voltage Vcc1 supplied to the power amplifier 2*a*.

The input terminal 141*b* is connected to the supply modulator 30*b* through a selection terminal 151*b* of a band select switch circuit 50*b*.

The output terminal 142*b* is a terminal from which the voltage filtered by the filter circuit 40*d* is output. The voltage output from the output terminal 142*b* is the power supply voltage Vcc2 supplied to the power amplifier 2*b*.

The filter circuit 40*d* includes a first filter circuit 45 between the input terminal 141*a* and the output terminal 142*a*, and a second filter circuit 46 between the input terminal 141*b* and the output terminal 142*b*.

The inductor L0 and the inductor L3 are connected between the input terminal 141*a* and the output terminal 142*a*. More specifically, one end (e.g., the first end) of the inductor L0 is connected to the input terminal 141*a*, and the other end (e.g., the second end) of the inductor L0 is connected to one end (e.g., the first end) of the inductor L3. The other end (e.g., the second end) of the inductor L3 is connected to the output terminal 142*a*.

The inductor L1 and the capacitor C1 are connected in series between the other end (e.g., the second end) of the inductor L0 and the ground. More specifically, one end (e.g., the first end) of the inductor L1 is connected to the other end (e.g., the second end) of the inductor L0, the other end (e.g., the second end) of the inductor L1 is connected to one of two electrodes of the capacitor C1, and the other of the two electrodes of the capacitor C1 is connected to the ground. That is, the first filter circuit 45 includes an LC series circuit 41 including the inductor L1 and the capacitor C1.

The inductor L4 and the capacitor C3 are connected in series between the other end (e.g., the second end) of the inductor L3 and the ground. More specifically, one end (e.g., the first end) of the inductor L4 is connected to the other end (e.g., the second end) of the inductor L3, the other end (e.g., the second end) of the inductor L4 is connected to one of two electrodes of the capacitor C3, and the other of the two electrodes of the capacitor C3 is connected to the ground. That is, the first filter circuit 45 includes an LC series circuit 43 including the inductor L4 and the capacitor C3.

The filter characteristics of the first filter circuit 45 in the filter circuit 40*d* have two attenuation poles. The frequency of one of the two attenuation poles is determined by the circuit constant of each of the inductor L1 and the capacitor C1. The frequency of the other attenuation pole of the two attenuation poles is determined by the circuit constant of each of the inductor L4 and the capacitor C3.

The inductor L5 is connected between the input terminal 141*b* and the output terminal 142*b*. More specifically, one end (e.g., the first end) of the inductor L5 is connected to the input terminal 141*b*, and the other end (e.g., the second end) of the inductor L5 is connected to the output terminal 142*b*.

The inductor L6 and the capacitor C4 are connected in series between the other end (e.g., the second end) of the inductor L5 and the ground. More specifically, one end (e.g., the first end) of the inductor L6 is connected to the other end (e.g., the second end) of the inductor L5, the other end (e.g., the second end) of the inductor L6 is connected to one of two electrodes of the capacitor C4, and the other of the two electrodes of the capacitor C4 is connected to the ground. That is, the second filter circuit 46 includes an LC series circuit 44 including the inductor L6 and the capacitor C4.

The filter characteristics of the second filter circuit 46 in the filter circuit 40*d* have one attenuation pole. The frequency of the attenuation pole is determined by the circuit constant of each of the inductor L6 and the capacitor C4.

In the tracker module 100*a* according to Embodiment 6, the six inductors L0, L1, and L3 to L6 and the three capacitors C1, C3, and C4 included in the filter circuit 40*d* are disposed at a module laminate 9. More specifically, the six inductors L0, L1, and L3 to L6 and the three capacitors C1, C3, and C4 are disposed on a first main surface 91 of the module laminate 9. Each of the six inductors L0, L1, and L3 to L6 is a chip inductor. That is, each of the six inductors L0, L1, and L3 to L6 is a surface-mounted inductor. The three capacitors C1, C3, and C4 are chip capacitors. That is, the three capacitors C1, C3, and C4 are surface-mounted capacitors.

The inductors L0 and L5 included in the filter circuit 40*d* are adjacent to the IC chip 80 in the plan view in a thickness direction D0 of the module laminate 9. The three inductors L0 and L5 included in the filter circuit 40*d* are adjacent to a BS switch portion 105 of the IC chip 80 in the plan view in the thickness direction D0 of the module laminate 9.

The two inductors L0 and L1 of the filter circuit 40*d* are adjacent to each other in the plan view in the thickness direction D0 of the module laminate 9. A magnetic flux direction of the inductor L0 and a magnetic flux direction of the inductor L1 are perpendicular to each other. In the plan view in the thickness direction D0 of the module laminate 9, the inductors L0 and L1 have a rectangular shape, and a longitudinal direction of the inductor L0 and a longitudinal direction of the inductor L1 are perpendicular to each other.

The two inductors L1 and L3 of the filter circuit 40d are adjacent to each other in the plan view in the thickness direction D0 of the module laminate 9. The magnetic flux direction of the inductor L1 and a magnetic flux direction of the inductor L3 are perpendicular to each other. In the plan view in the thickness direction D0 of the module laminate 9, the inductor L3 has a rectangular shape, and the longitudinal direction of the inductor L1 and a longitudinal direction of the inductor L3 are perpendicular to each other.

The two inductors L3 and L4 of the filter circuit 40d are adjacent to each other in the plan view in the thickness direction D0 of the module laminate 9. The magnetic flux direction of the inductor L3 and a magnetic flux direction of the inductor L4 are perpendicular to each other. In the plan view in the thickness direction D0 of the module laminate 9, the inductor L4 has a rectangular shape, and the longitudinal direction of the inductor L3 and a longitudinal direction of the inductor L4 are perpendicular to each other.

The two inductors L5 and L6 of the filter circuit 40d are adjacent to each other in the plan view in the thickness direction D0 of the module laminate 9. A magnetic flux direction of the inductor L5 and a magnetic flux direction of the inductor L6 are perpendicular to each other. In the plan view in the thickness direction D0 of the module laminate 9, the inductors L5 and L6 have a rectangular shape, and a longitudinal direction of the inductor L5 and a longitudinal direction of the inductor L6 are perpendicular to each other.

The two inductors L1 and L5 of the filter circuit 40d are adjacent to each other in the plan view in the thickness direction D0 of the module laminate 9. The magnetic flux direction of the inductor L1 and the magnetic flux direction of the inductor L5 are perpendicular to each other. In the plan view in the thickness direction D0 of the module laminate 9, the longitudinal direction of the inductor L1 and the longitudinal direction of the inductor L5 are perpendicular to each other.

The two inductors L3 and L6 of the filter circuit 40d are adjacent to each other in the plan view in the thickness direction D0 of the module laminate 9. The magnetic flux direction of the inductor L3 and the magnetic flux direction of the inductor L6 are perpendicular to each other. In the plan view in the thickness direction D0 of the module laminate 9, the longitudinal direction of the inductor L3 and the longitudinal direction of the inductor L6 are perpendicular to each other.

The inductor L0 of the filter circuit 40d is not adjacent to the inductors L3 and L4 in the plan view in the thickness direction D0 of the module laminate 9. More specifically, the inductor L1 is located between the inductor L0, and the inductors L3 and L4.

The two inductors L1 and L4 of the filter circuit 40d are not adjacent to each other in the plan view in the thickness direction D0 of the module laminate 9. More specifically, the inductor L3 is located between the inductor L1 and the inductor L4.

The two inductors L4 and L6 of the filter circuit 40d are not adjacent to each other in the plan view in the thickness direction D0 of the module laminate 9. More specifically, the capacitor C4 is located between the inductor L4 and the inductor L6.

As a result, in the tracker module 100a according to Embodiment 6, magnetic coupling between the inductor L1, and the inductors L0 and L2 is less likely to occur. Magnetic coupling between the inductor L3 and the inductor L4 is also less likely to occur. Magnetic coupling between the inductor L5 and the inductor L6 is also less likely to occur. Magnetic coupling between the inductor L1 and the inductor L5 is also less likely to occur. Magnetic coupling between the inductor L3 and the inductor L6 is also less likely to occur. Magnetic coupling is less likely to occur between the inductor L0 and the inductor L3, between the inductor L0 and the inductor L4, between the inductor L1 and the inductor L4, and between the inductor L4 and the inductor L6. Thus, in the tracker module 100a according to Embodiment 6, the filter characteristics are less likely to deteriorate in both the first filter circuit 45 and the second filter circuit 46 of the filter circuit 40d.

In the tracker module 100a according to Embodiment 6, in the plan view in the thickness direction of the module laminate 9, the inductors L0 and L1 are adjacent to each other, the inductors L1 and L3 are adjacent to each other, the inductors L3 and L4 are adjacent to each other, the inductors L5 and L6 are adjacent to each other, the inductors L1 and L5 are adjacent to each other, and the inductors L3 and L6 are adjacent to each other. Thus, the size of the tracker module 100a can be reduced as compared to a case where any two of the inductors L0 to L6 are not adjacent to each other in the plan view in the thickness direction of the module laminate 9.

In the tracker module 100a according to Embodiment 6, the inductor L0 has the first end that is connected to the IC chip 80 and the second end that is connected to an output terminal 164a. The inductor L1 has a third end (e.g., the first end) that is connected to the second end of the inductor L0 and a fourth end (e.g., the second end) that is connected to the ground. As a result, magnetic coupling is less likely to occur between the inductor L1 and the inductor L0. Thus, in the tracker module 100a according to Embodiment 6, the change in the circuit constant of the inductor L1 due to the magnetic coupling can be reduced, so that it is possible to reduce the change in the frequency of the attenuation pole of the first filter circuit 45 of the filter circuit 40d.

In the tracker module 100a according to Embodiment 6, the inductor L3 has the first end that is connected to the IC chip 80 and the second end that is connected to the output terminal 164a. The second inductor L1 has a third end (e.g., the first end) that is connected to the first end of the inductor L3 and a fourth end (e.g., the second end) that is connected to the ground. As a result, magnetic coupling is less likely to occur between the inductor L1 and the inductor L3. Thus, in the tracker module 100a according to Embodiment 6, the change in the circuit constant of the inductor L1 due to the magnetic coupling can be reduced, so that it is possible to reduce the change in the frequency of the attenuation pole of the first filter circuit 45 of the filter circuit 40d.

In the tracker module 100a according to Embodiment 6, the inductor L3 has the first end that is connected to the IC chip 80 and the second end that is connected to the output terminal 164a. The inductor L4 has a third end (e.g., the first end) that is connected to the second end of the inductor L3 and a fourth end (e.g., the second end) that is connected to the ground. As a result, magnetic coupling is less likely to occur between the inductor L4 and the inductor L3. Thus, in the tracker module 100a according to Embodiment 6, the change in the circuit constant of the inductor L4 due to the magnetic coupling can be reduced, so that it is possible to reduce the change in the frequency of the attenuation pole of the first filter circuit 45 in the filter circuit 40d.

Further, in the tracker module 100a according to Embodiment 6, the inductor L5 has a first end that is connected to the IC chip 80 and a second end that is connected to an output terminal 164*b*. The inductor L6 has a third end (e.g., the first end) that is connected to the second end of the inductor L5 and a fourth end (e.g., the second end) that is connected to the ground. As a result, magnetic coupling is less likely to occur between the inductor L6 and the inductor L5. Thus, in the tracker module 100*a* according to Embodiment 6, the change in the circuit constant of the inductor L6 due to the magnetic coupling can be reduced, so that it is possible to reduce the change in the frequency of the attenuation pole of the second filter circuit 46 in the filter circuit 40*d*.

The tracker module 100*a* according to Embodiment 6 further includes the supply modulator 30*a* and the supply modulator 30*b* that is configured to selectively output, to the filter circuit 40*d*, at least one of the plurality of discrete voltages. The filter circuit 40*d* includes the inductor L5 connected to the supply modulator 30*b*. The inductor L1 is connected to the supply modulator 30. The inductor L1 and the inductor L5 are adjacent to each other. The magnetic flux direction of the inductor L1 and the magnetic flux direction of the inductor L3 are perpendicular to each other, whereby magnetic coupling between the inductor L1 and the inductor L5 is less likely to occur. Therefore, in the tracker module 100*a* according to Embodiment 6, it is possible to reduce the change in the frequency of the attenuation pole in each of the filter circuit 40*c* and the filter circuit 40*d* due to magnetic coupling.

In the tracker module 100*a* according to Embodiment 6, the filter circuit 40 includes the inductor L6 connected to the supply modulator 30*b*. The inductor L3 is connected to the supply modulator 30. The inductor L3 and the inductor L6 are adjacent to each other. The magnetic flux direction of the inductor L3 and the magnetic flux direction of the inductor L6 are perpendicular to each other, whereby magnetic coupling between the inductor L3 and the inductor L6 is less likely to occur. Thus, in the tracker module 100*a* according to Embodiment 6, it is possible to reduce the change in the frequency of the attenuation pole in each of the filter circuit 40*c* and the filter circuit 40*d* due to magnetic coupling.

Embodiment 7

Figure 17:
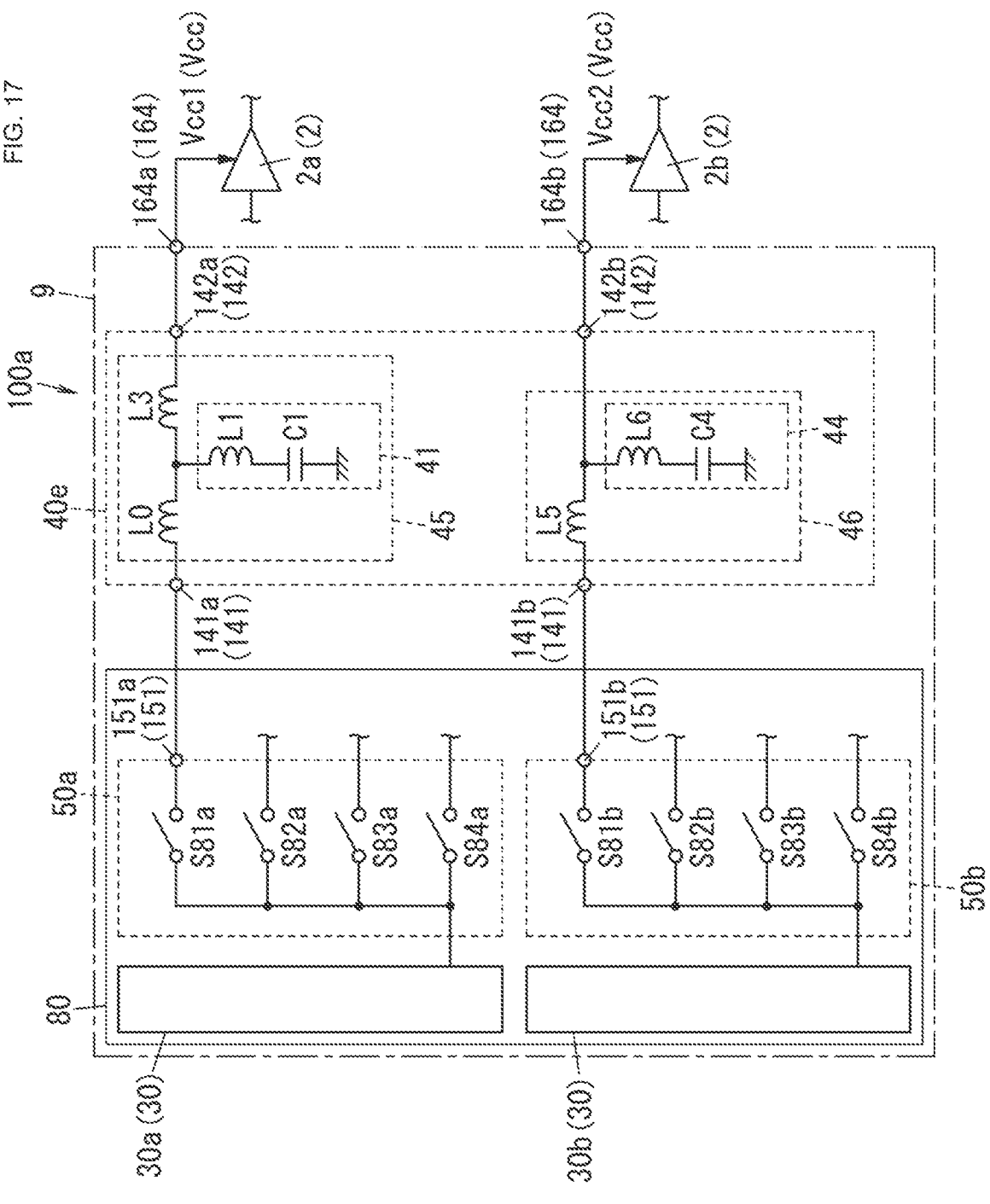
FIG. 17 is a circuit diagram of a tracker module according to Embodiment 7.
Figure 18:
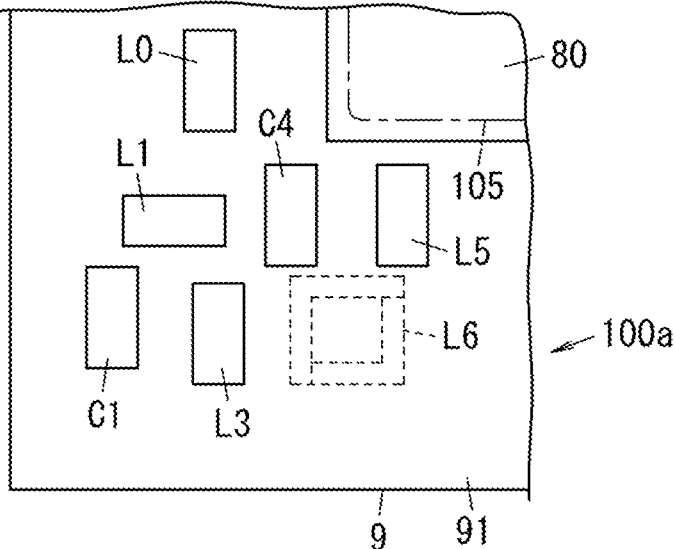
FIG. 18 is a partial plan view of the tracker module according to Embodiment 7.

As illustrated in FIG. 17, a tracker module 100*a* according to Embodiment 7 supplies a power supply voltage Vcc to a plurality (two in FIG. 17) of power amplifiers 2.

In particular, the tracker module 100*a* includes a plurality (two in FIG. 17) of supply modulators 30. The tracker module 100*a* further includes a plurality (two in FIG. 17) of band select switch circuits 50. A band select switch circuit 50*a* includes switches S81*a* to S84*a*. A band select switch circuit 50*b* includes switches S81*b* to S84*b*.

A filter circuit 40*e* includes a plurality of input terminals 141, a plurality of output terminals 142, a plurality of inductors, and one or more capacitors. The plurality of input terminals 141 include input terminals 141*a* and 141*b*. The plurality of output terminals 142 include output terminals 142*a* and 142*b*. The plurality of inductors includes five inductors L0, L1, L3, L5, and L6. The one or more capacitors include two capacitors C1 and C4.

The input terminal 141*a* is connected to a supply modulator 30*a* through a band select switch circuit 50*a*. The output terminal 142*a* is a terminal from which the voltage filtered by the filter circuit 40*e* is output. The voltage output from the output terminal 142*a* is the power supply voltage Vcc1 supplied to a power amplifier 2*a*.

The input terminal 141*b* is connected to the supply modulator 30*b* through a band select switch circuit 50*b*.

The output terminal 142*b* is a terminal from which the voltage filtered by the filter circuit 40*e* is output. The voltage output from the output terminal 142*b* is the power supply voltage Vcc2 supplied to the power amplifier 2*b*.

The filter circuit 40*e* includes a first filter circuit 45 between the input terminal 141*a* and the output terminal 142*a*, and a second filter circuit 46 between the input terminal 141*b* and the output terminal 142*b*.

The inductor L0 and the inductor L3 are connected between the input terminal 141*a* and the output terminal 142*a*. More specifically, one end (e.g., the first end) of the inductor L0 is connected to the input terminal 141*a*, and the other end (e.g., the second end) of the inductor L0 is connected to one end (e.g., the first end) of the inductor L3. The other end (e.g., the second end) of the inductor L3 is connected to the output terminal 142*a*.

The inductor L1 and the capacitor CI are connected in series between the other end (e.g., the second end) of the inductor L0 and the ground. More specifically, one end (e.g., the first end) of the inductor L1 is connected to the other end (e.g., the second end) of the inductor L0, the other end (e.g., the second end) of the inductor L1 is connected to one of two electrodes of the capacitor C1, and the other of the two electrodes of the capacitor C1 is connected to the ground. That is, the first filter circuit 45 includes an LC series circuit 41 including the inductor L1 and the capacitor C1.

The filter characteristics of the first filter circuit 45 in the filter circuit 40*e* have one attenuation pole. The frequency of the attenuation pole is determined by the circuit constant of each of the inductor L1 and the capacitor C1.

The inductor L5 is connected between the input terminal 141*b* and the output terminal 142*b*. More specifically, one end (e.g., the first end) of the inductor L5 is connected to the input terminal 141*b*, and the other end (e.g., the second end) of the inductor L5 is connected to the output terminal 142*b*.

The inductor L6 and the capacitor C4 are connected in series between the other end (e.g., the second end) of the inductor L5 and the ground. More specifically, one end (e.g., the first end) of the inductor L6 is connected to the other end (e.g., the second end) of the inductor L5, the other end (e.g., the second end) of the inductor L6 is connected to one of two electrodes of the capacitor C4, and the other of the two electrodes of the capacitor C4 is connected to the ground. That is, the second filter circuit 46 includes an LC series circuit 44 including the inductor L6 and the capacitor C4.

The filter characteristics of the second filter circuit 46 in the filter circuit 40*e* have one attenuation pole. The frequency of the attenuation pole is determined by the circuit constant of each of the inductor L6 and the capacitor C4.

In the tracker module 100*a* according to Embodiment 7, the five inductors L0, L1, L3, L5, and L6 and the two capacitors C1 and C4 included in the filter circuit 40*e* are disposed at a module laminate 9. More specifically, the five inductors L0, L1, L3, L5, and L6 and the two capacitors C1 and C4 are disposed on a first main surface 91 of the module laminate 9. Each of the four inductors L0, L1, L3, and L5 among the five inductors L0, L1, L3, L5, and L6 is a chip inductor. That is, each of the four inductors L0, L1, L3, and L5 is a surface-mounted inductor. The two capacitors C1 and C4 are chip capacitors. That is, the two capacitors C1 and C4 are surface-mounted capacitors.

One inductor L6 among the five inductors L0, L1, L3, L5, and L6 is an inner layer inductor built (e.g., formed or otherwise disposed) in the module laminate 9. That is, for purposes of this disclosure, the phrase "one inductor L6 is built in the module laminate 9" means that the inner layer inductor L6 is disposed inside the module laminate 9. The inner layer inductor L6 may be disposed on either one of the first main surface 91 and a second main surface 92 of the module laminate 9. The inner layer inductor L6 may be disposed at the module laminate 9 in a state where a portion of the inner layer inductor L6 is exposed to one or both of the first main surface 91 and the second main surface 92 of the module laminate 9. The inner layer inductor L6 includes one or more conductor portions. More specifically, the inner layer inductor L6 includes a plurality of conductor portions and a via conductor. The plurality of conductor portions has an L-shape in the plan view in the thickness direction D0 of the module laminate 9. The plurality of conductor portions is disposed to form a spiral shape as the entirety of the inner layer inductor L6 in the plan view in the thickness direction D0 of the module laminate 9. Therefore, an extending direction of a winding axis of the inner layer inductor L6 is the thickness direction D0 of the module laminate 9.

The inductors L0 and L5 included in the filter circuit 40e are adjacent to the IC chip 80 in the plan view in a thickness direction D0 of the module laminate 9. The five inductors L0 and L5 included in the filter circuit 40e are adjacent to a BS switch portion 105 of the IC chip 80 in the plan view in the thickness direction D0 of the module laminate 9.

The two inductors L0 and L1 of the filter circuit 40e are adjacent to each other in the plan view in the thickness direction D0 of the module laminate 9. A magnetic flux direction of the inductor L0 and a magnetic flux direction of the inductor L1 are perpendicular to each other. In the plan view in the thickness direction D0 of the module laminate 9, the inductors L0 and L1 have a rectangular shape, and a longitudinal direction of the inductor L0 and a longitudinal direction of the inductor L1 are perpendicular to each other.

The two inductors L1 and L3 of the filter circuit 40e are adjacent to each other in the plan view in the thickness direction D0 of the module laminate 9. The magnetic flux direction of the inductor L1 and a magnetic flux direction of the inductor L3 are perpendicular to each other. In the plan view in the thickness direction D0 of the module laminate 9, the inductor L3 has a rectangular shape, and the longitudinal direction of the inductor L1 and a longitudinal direction of the inductor L3 are perpendicular to each other.

The two inductors L5 and L6 of the filter circuit 40e are adjacent to each other in the plan view in the thickness direction D0 of the module laminate 9. A magnetic flux direction of the inductor L5 and a magnetic flux direction of the inductor L6 are perpendicular to each other.

The two inductors L3 and L6 of the filter circuit 40e are adjacent to each other in the plan view in the thickness direction D0 of the module laminate 9. The magnetic flux direction of the inductor L3 and the magnetic flux direction of the inductor L6 are perpendicular to each other. Here, the inductor L3 is connected to the supply modulator 30a. The inductor L6 is connected to the supply modulator 30b.

The inductor L0 of the filter circuit 40e is not adjacent to the inductor L3 in the plan view in the thickness direction D0 of the module laminate 9. More specifically, the inductor L1 is located between the inductor L0 and the inductor L3.

As a result, in the tracker module 100a according to Embodiment 7, magnetic coupling between the inductor L1, and the inductors L0 and L3 is less likely to occur. Magnetic coupling between the inductor L5 and the inductor L6 is also less likely to occur. Magnetic coupling between the inductor L5 and the inductor L6 is also less likely to occur. Magnetic coupling between the inductor L3, and the inductors L0 and L5 and between the inductor L1 and the inductor L5 is not likely to occur. Thus, in the tracker module 100 according to Embodiment 7, the filter characteristics are less likely to deteriorate in both the first filter circuit 45 and the second filter circuit 46 of the filter circuit 40e.

In the tracker module 100a according to Embodiment 7, in the plan view in the thickness direction of the module laminate 9, the inductors L0 and L1 are adjacent to each other, the inductors L1 and L3 are adjacent to each other, the inductors L5 and L6 are adjacent to each other, and the inductors L3 and L6 are adjacent to each other. Thus, the size of the tracker module 100a can be reduced as compared to a case where the inductors L1 and L6 are not adjacent to other inductors in the plan view in the thickness direction of the module laminate 9.

In the tracker module 100a according to Embodiment 7, the inductor L0 has the first end that is connected to the IC chip 80 and the second end that is connected to the output terminal 164a. The inductor L1 has a third end (e.g., the first end) that is connected to the second end of the inductor L0 and a fourth end (e.g., the second end) that is connected to the ground. As a result, magnetic coupling is less likely to occur between the inductor L1 and the inductor L0. Thus, in the tracker module 100a according to Embodiment 7, the change in the circuit constant of the inductor L1 due to the magnetic coupling can be reduced, so that it is possible to reduce the change in the frequency of the attenuation pole of the first filter circuit 45 in the filter circuit 40e.

In the tracker module 100a according to Embodiment 7, the inductor L3 has the first end that is connected to the IC chip 80 and the second end that is connected to an output terminal 164a. The inductor L1 has a third end (e.g., the first end) that is connected to the first end of the inductor L3 and a fourth end (e.g., the second end) that is connected to the ground. As a result, magnetic coupling is less likely to occur between the inductor L1 and the inductor L3. Thus, in the tracker module 100a according to Embodiment 7 the change in the circuit constant of the inductor L1 due to the magnetic coupling can be reduced, so that it is possible to reduce the change in the frequency of the attenuation pole of the first filter circuit 45 in the filter circuit 40e.

Further, in the tracker module 100a according to Embodiment 7, the inductor L5 has the first end that is connected to the IC chip 80 and the second end that is connected to an output terminal 164b. The inductor L6 has a third end (e.g., the first end) that is connected to the second end of the inductor L5 and a fourth end (e.g., the second end) that is connected to the ground. As a result, magnetic coupling is less likely to occur between the inductor L6 and the inductor L5. Thus, in the tracker module 100a according to Embodiment 7, the change in the circuit constant of the inductor L6 due to the magnetic coupling can be reduced, so that it is possible to reduce the change in the frequency of the attenuation pole of the second filter circuit 46 in the filter circuit 40e.

The tracker module 100a according to Embodiment 7 further includes the supply modulator 30a and the supply modulator 30b. The inductor L3 is connected to the supply modulator 30a. The inductor L6 is connected to the supply modulator 30b. As a result, magnetic coupling is less likely to occur between the inductor L3 and the inductor L6. Thus, in the tracker module 100a according to Embodiment 7, the change in the circuit constant of the inductor L6 due to the magnetic coupling can be reduced, so that it is possible to reduce the change in the frequency of the attenuation pole of the second filter circuit 46 included in the filter circuit 40e.

Embodiment 8

A tracker module 100 according to Embodiment 8 includes a filter circuit 40a (see FIG. 8).

Figure 19:
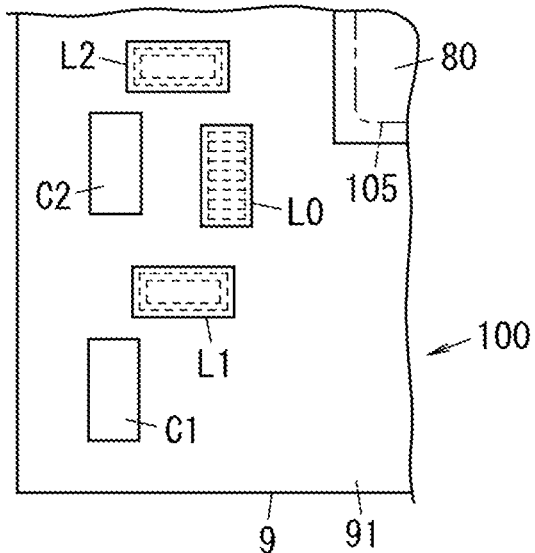
FIG. 19 is a partial plan view of a tracker module according to Embodiment 8.

In the tracker module 100 according to Embodiment 8, as illustrated in FIG. 19, three inductors L0, L1, and L2 and two capacitors C1 and C2 included in the filter circuit 40a are disposed at a module laminate 9. More specifically, the three inductors L0, L1, and L2 and the two capacitors C1 and C2 are disposed on a first main surface 91 of the module laminate 9. Each of the three inductors L0, L1, and L2 is a chip inductor. That is, each of the three inductors L0, L1, and L2 is a surface-mounted inductor. The two capacitors C1 and C2 are chip capacitors. That is, the two capacitors C1 and C2 are surface-mounted capacitors.

According to the exemplary aspect, an extending direction of a winding axis of one inductor L0 among the three inductors L0, L1, and L2 is a longitudinal direction of the inductor L0. An extending direction of a winding axes of the two inductors L1 and L2 among the three inductors L0, L1, and L2 is a thickness direction D0 of the module laminate 9.

Thus, the two inductors L0 and L1 of the filter circuit 40a are adjacent to each other in the plan view in the thickness direction D0 of the module laminate 9. A magnetic flux direction of the inductor L0 and a magnetic flux direction of the inductor L1 are perpendicular to each other. In the plan view in the thickness direction D0 of the module laminate 9, the inductors L0 and L1 have a rectangular shape, and a longitudinal direction of the inductor L1 and a longitudinal direction of the inductor L2 are perpendicular to each other.

The two inductors L0 and L2 of the filter circuit 40a are adjacent to each other in the plan view in the thickness direction D0 of the module laminate 9. The magnetic flux direction of the inductor L0 and a magnetic flux direction of the inductor L2 are perpendicular to each other. In the plan view in the thickness direction D0 of the module laminate 9, the inductor L2 has a rectangular shape, and the longitudinal direction of the inductor L0 and a longitudinal direction of the inductor L2 are perpendicular to each other.

The inductors L0 and L2 included in the filter circuit 40a are adjacent to the IC chip 80 in the plan view in a thickness direction D0 of the module laminate 9. The inductors L0 and L2 included in the filter circuit 40a are adjacent to a BS switch portion 105 of the IC chip 80 in the plan view in the thickness direction D0 of the module laminate 9.

The two inductors L1 and L2 of the filter circuit 40a are not adjacent to each other in the plan view in the thickness direction D0 of the module laminate 9. More specifically, the capacitor C2 is located between the inductor L1 and the inductor L2.

As a result, in the tracker module 100 according to Embodiment 8, magnetic coupling between the inductor L0, and the inductors L1 and L2 is less likely to occur. Magnetic coupling between the inductor L1 and the inductor L2 is also less likely to occur. Thus, in the tracker module 100 according to Embodiment 8, the filter characteristics are less likely to deteriorate in the filter circuit 40a.

In the tracker module 100 according to Embodiment 8, in the plan view in the thickness direction of the module laminate 9, the inductors L0 and L1 are adjacent to each other, and the inductors L0 and L2 are adjacent to each other. Thus, the size of the tracker module 100 can be reduced as compared to a case where the inductor L0 is adjacent to neither the inductor L1 nor the inductor L2 in the plan view in the thickness direction of the module laminate 9.

In the tracker module 100 according to Embodiment 8, the first inductor L0 has the first end that is connected to the IC chip 80 and the second end that is connected to the output terminal 164. The second inductor L2 has a third end (e.g., the first end) that is connected to the first end of the first inductor L0 and a fourth end (e.g., the second end) that is connected to the ground. As a result, magnetic coupling is less likely to occur between the inductor L2 and the inductor L0. Thus, in the tracker module 100 according to Embodiment 8, the change in the circuit constant of the inductor L2 due to the magnetic coupling can be reduced, so that it is possible to reduce the change in the frequency of the attenuation pole of the filter circuit 40a.

In the tracker module 100 according to Embodiment 8, the first inductor L0 has the first end that is connected to the IC chip 80 and the second end that is connected to the output terminal 164. The second inductor L1 has a third end (e.g., the first end) that is connected to the second end of the first inductor L0 and a fourth end (e.g., the second end) that is connected to the ground. As a result, magnetic coupling is less likely to occur between the inductor L1 and the inductor L0. Thus, in the tracker module 100 according to Embodiment 8, the change in the circuit constant of the inductor L1 due to the magnetic coupling can be reduced, so that it is possible to reduce the change in the frequency of the attenuation pole of the filter circuit 40a.

Embodiment 9

A tracker module 100 according to Embodiment 9 includes a filter circuit 40a (see FIG. 8). In the tracker module according to Embodiment 9, a magnetic flux direction of one of inductors included in the filter circuit 40a and a magnetic flux direction of a power inductor L71 are perpendicular to each other.

Figure 20:
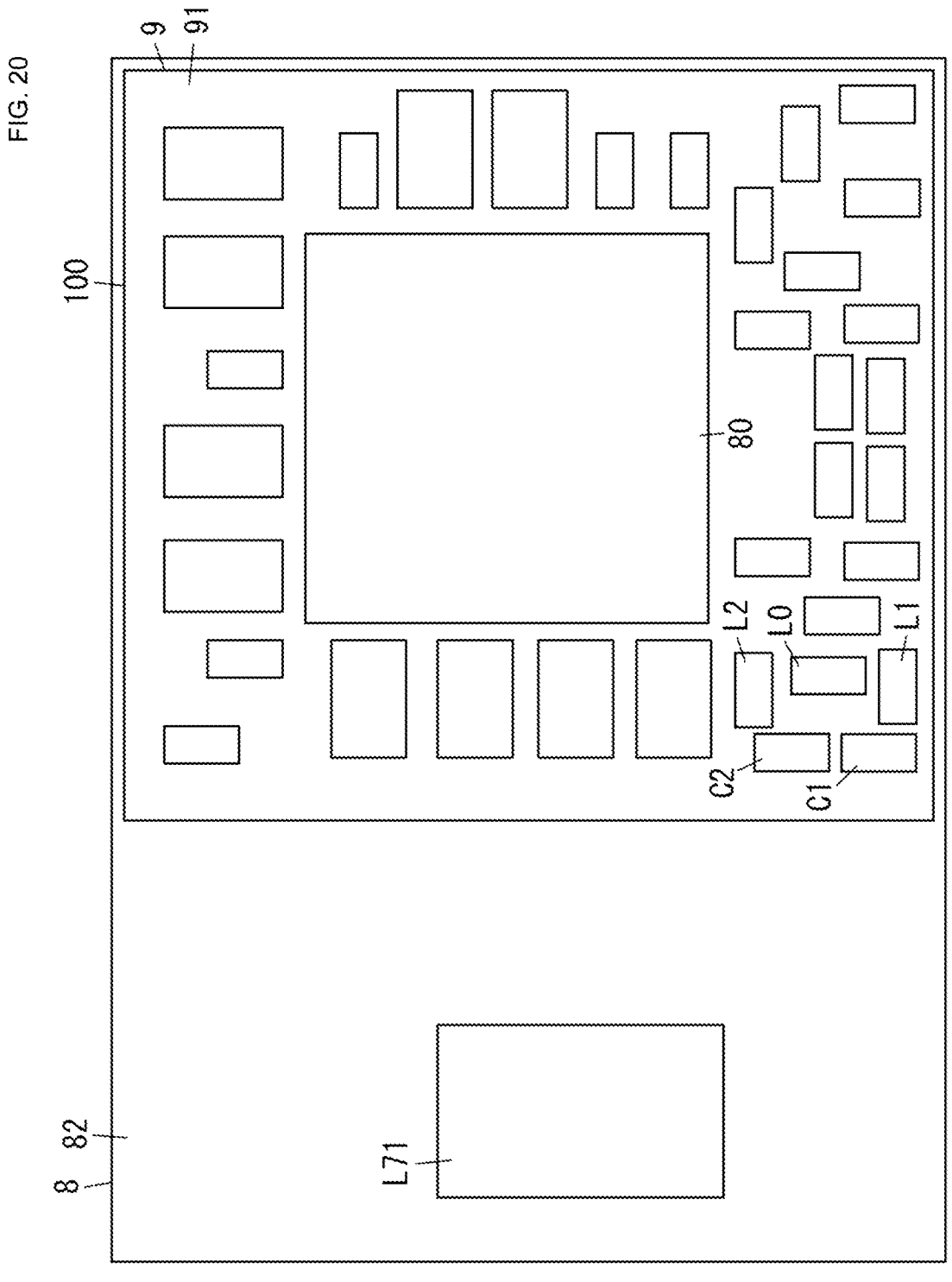
FIG. 20 is a plan view of a tracker module according to Embodiment 9.

In the tracker module 100 according to Embodiment 9, as illustrated in FIG. 20, three inductors L0, L1, and L2 and two capacitors C1 and C2 included in the filter circuit 40a are disposed at a module laminate 9. More specifically, the three inductors L0, L1, and L2 and the two capacitors C1 and C2 are disposed on a first main surface 91 of the module laminate 9. Each of the three inductors L0, L1, and L2 is a chip inductor. That is, each of the three inductors L0, L1, and L2 is a surface-mounted inductor. The two capacitors C1 and C2 are chip capacitors. That is, the two capacitors C1 and C2 are surface-mounted capacitors.

The tracker module 100 and the power inductor L71 according to Embodiment 9 are disposed at a board (motherboard) 8. The board 8 is, for example, a multilayer laminate in which a plurality of dielectric layers and a plurality of conductive layers (not illustrated) are laminated. A material of each conductive layer is, for example, copper. The board 8 is, for example, a low temperature co-fired ceramics (LTCC) board. The board 8 is not limited to the LTCC board, and may be, for example, a printed wiring board, a high temperature co-fired ceramics (HTCC) board, a resin multilayer laminate, or a component-embedded board.

For purposes of this disclosure, the phrase that "the tracker module 100 is disposed at the board 8" includes a case where the tracker module 100 is mechanically connected to the board 8 and a case where the tracker module 100 is electrically connected to the board 8. Similarly, the phrase that "the power inductor L71 is disposed at the board 8" includes a case where the power inductor L71 is mechanically connected to the board 8 and a case where the power inductor L71 is electrically connected to the board 8. The tracker module 100 and the power inductor L71 are disposed on a third main surface 82 of the board 8.

A magnetic flux direction of the power inductor L71 is a longitudinal direction of the power inductor L71.

The power inductor L71 and the inductor L2 are adjacent to each other in the plan view in the thickness direction D0 of the module laminate 9. The magnetic flux direction of the power inductor L71 and a magnetic flux direction of the inductor L2 are perpendicular to each other. More specifically, an extending direction of a winding axis of the power inductor L71 and an extending direction of a winding axis of the inductor L2 are perpendicular to each other. In the plan view in the thickness direction D0 of the module laminate 9, the inductors L71 and L2 have a rectangular shape, and the longitudinal direction of the inductor L71 and a longitudinal direction of the inductor L2 are perpendicular to each other.

The power inductor L71 and the inductor L0 are not adjacent to each other in the plan view in the thickness direction D0 of the module laminate 9. More specifically, the capacitor C2 is located between the power inductor L71 and the inductor L0.

The power inductor L71 and the inductor L1 are not adjacent to each other in the plan view in the thickness direction D0 of the module laminate 9. More specifically, the capacitor C1 is located between the power inductor L71 and the inductor L1.

As a result, in the tracker module 100 according to Embodiment 9, magnetic coupling of each of the inductors L0 to L2 with the power inductor L71 is less likely to occur. Thus, in the tracker module 100 according to Embodiment 9, the filter characteristics are less likely to deteriorate in the filter circuit 40a.

In the tracker module 100 according to Embodiment 9, in the plan view in the thickness direction of the module laminate 9, the inductors L0 and L1 are adjacent to each other, and the inductors L0 and L2 are adjacent to each other. Thus, the size of the tracker module 100 can be reduced as compared to a case where the inductor L0 is adjacent to neither the inductor L1 nor the inductor L2 in the plan view in the thickness direction of the module laminate 9.

In the tracker module 100 according to Embodiment 9, a switched-capacitor circuit 20 (see FIG. 6) is connected to a pre-regulator circuit 10 (see FIG. 6) configured to convert a DC voltage into an input voltage by using the power inductor L71. The magnetic flux direction of the inductor L2 and the magnetic flux direction of the power inductor L71 are perpendicular to each other. Accordingly, in the tracker module 100, magnetic coupling is less likely to occur between the inductor L2 and the power inductor L71. Thus, in the tracker module 100 according to Embodiment 9, the filter characteristics are less likely to deteriorate in the filter circuit 40a.

Embodiment 10

A tracker module 100 according to Embodiment 10 includes a filter circuit 40a (see FIG. 8).

Figure 21A:
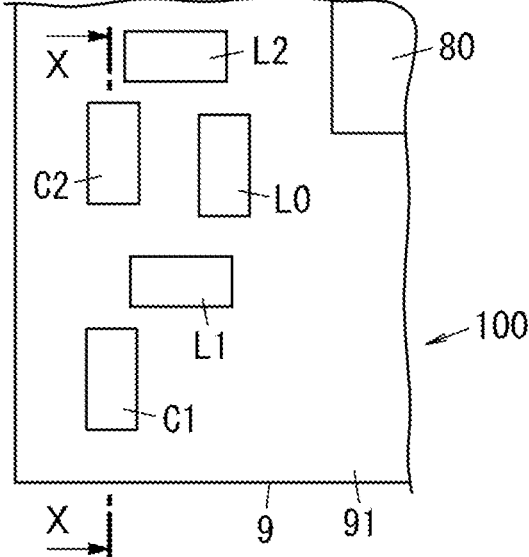
FIG. 21A is a partial plan view of a tracker module according to Embodiment 10.
Figure 21B:
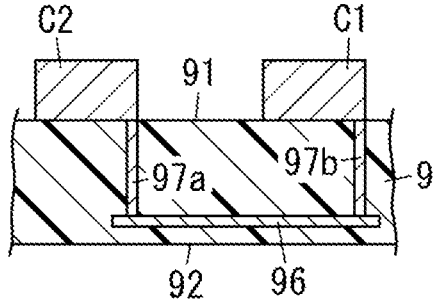
FIG. 21B is a partial cross-sectional view of the tracker module according to Embodiment 10.

In the tracker module 100 according to Embodiment 10, as illustrated in FIG. 21A, three inductors L0, L1, and L2 and two capacitors C1 and C2 included in the filter circuit 40a are disposed at a module laminate 9. More specifically, the three inductors L0, L1, and L2 and the two capacitors C1 and C2 are disposed on a first main surface 91 of the module laminate 9. Each of the three inductors L0, L1, and L2 is a chip inductor. That is, each of the three inductors L0, L1, and L2 is a surface-mounted inductor. The two capacitors C1 and C2 are chip capacitors. That is, the two capacitors C1 and C2 are surface-mounted capacitors.

According to the exemplary aspect, the capacitor C1 is connected to a ground electrode 96 through a via conductor 97b of the module laminate 9. The capacitor C2 is connected to the ground electrode 96 through a via conductor 97a of the module laminate 9. Here, the ground electrode 96 is built (e.g., formed or otherwise disposed) in the module laminate 9. That is, for purposes of this disclosure, the phrase "the ground electrode 96 is built in the module laminate 9" means that the ground electrode 96 is located inside the module laminate 9. In other words, the other end (e.g., the second end) of the capacitor C1 and the other end (e.g., the second end) of the capacitor C2 are not connected to each other on a first main surface 91 of the module laminate 9.

As a result, in the tracker module 100 according to Embodiment 10, an LC series circuit 41 and another LC series circuit (here, LC series circuit 43) are not connected to each other on the first main surface 91 of the module laminate 9. Thus, in the filter circuit 40a, it is possible to reduce an occurrence of a situation in which a signal flowing from the LC series circuit 41 to the ground further flows from the ground through the other LC series circuit (here, the LC series circuit 43) and is output from an output terminal 142. That is, in the tracker module 100 according to Embodiment 10, the filter characteristics are less likely to deteriorate in the filter circuit 40a.

MODIFICATIONS TO THE EXEMPLARY EMBODIMENTS

Modification of the exemplary embodiments will be described below.

In the tracker modules 100 and 100a according to Embodiments 1 to 10, each of the LC series circuits 41 to 44 may have the inductor connected to the ground, or may include a plurality of inductors or a plurality of capacitors.

In the tracker modules 100 and 100a according to Embodiments 1 to 10, the two inductors that are not adjacent may be adjacent to each other and the magnetic flux directions of such inductors may be perpendicular to each other.

For example, in any two of the LC series circuits 41 to 44 connected to the same supply modulator 30, the inductor included in one LC series circuit and the inductor included in the other LC series circuit may be adjacent to each other, and magnetic flux directions thereof may be perpendicular to each other. Further, in any two of the LC series circuits 41 to 44, both the inductor included in one LC series circuit and the inductor included in the other LC series circuit may have a rectangular shape and be adjacent to each other in the plan view in the thickness direction D0 of the module laminate 9. In addition, longitudinal directions thereof may be perpendicular to each other. For example, in the tracker module 100 according to Embodiment 2, the inductor L1 and the inductor L2 may be adjacent to each other, and the magnetic flux direction of the Inductor L1 and the magnetic flux direction of the inductor L2 may be perpendicular to each other. Further, for example, in the tracker module 100 according to Embodiment 2, the inductor L1 and the inductor L2 may be adjacent to each other, and the longitudinal direction of the inductor L1 and the longitudinal direction of the inductor L2 may be perpendicular to each other.

Further, for example, in the tracker module 100a, the inductor included in the LC series circuit connected to the supply modulator 30a and the inductor included in the LC series circuit connected to the supply modulator 30b may be adjacent to each other, and the magnetic flux directions thereof may be perpendicular to each other. Further, in the tracker module 100a, both the inductor included in the LC series circuit connected to the supply modulator 30a and the inductor included in the LC series circuit connected to the supply modulator 30b may have a rectangular shape and be adjacent to each other in the plan view in the thickness direction D0 of the module laminate 9. In addition, the longitudinal directions thereof may be perpendicular to each other. For example, in the tracker module 100a according to Embodiment 6, the inductor L4 and the inductor L6 may be adjacent to each other, and the magnetic flux direction of the inductor L4 and the magnetic flux direction of the inductor L6 may be perpendicular to each other. Further, for example, in the tracker module 100a according to Embodiment 6, the inductor L4 and the inductor L6 may be adjacent to each other, and the longitudinal direction of the inductor L4 and the longitudinal direction of the inductor L6 may be perpendicular to each other.

Similarly, with these configurations, magnetic coupling between the two inductors can be prevented, and the deterioration in the filter characteristics of the filter circuits 40 to 40e can be suppressed. By disposing the two inductors that are not adjacent to each other to be adjacent to each other, the size of the tracker module 100 and 100a can also be reduced.

Conversely, in the inductors L0 to L6 of the tracker modules 100 and 100a according to Embodiments 1 to 10, the two inductors that are adjacent to each other and have magnetic flux directions that are perpendicular to each other may be configured not to be adjacent to each other by disposing another element between the two inductors.

The tracker modules 100 and 100a according to Embodiments 1 to 10 does not need to include the band select switch circuit 50. In this case, the filter circuits 40 to 40e are directly connected to the supply modulator 30. In this case, each of the inductors L0 to L6 included in the filter circuits 40 to 40e is adjacent to the SM switch portion 104 in the IC chip 80. That is, each of the inductors L0 to L6 included in the filter circuits 40 to 40e is adjacent to the switches S51 to S54 included in the supply modulator 30. As a result, the noise immunity of the tracker module 100 and 100a is improved.

In the present specification, the phrase that "the inductor L0 and the inductor L1 are adjacent to each other" means that there is no other component between the inductor L0 and the inductor L1. The inductor L0 and the inductor L1 may or do not need to be in contact with each other. In an exemplary aspect, when the inductor L0 and the inductor L1 are not in contact with each other, a distance between the inductor L0 and the inductor L1 is equal to or less than a predetermined reference. The predetermined reference is, for example, a width of a chip inductor in a short-side direction in a case where the inductor L0 and the inductor L1 are chip inductors having the same size. In addition, the predetermined reference is, for example, the width of the inductor L0 in the short-side direction in a case where the inductor L0 and the inductor L1 are both chip inductors, and the inductor L0 is larger than the inductor L1. The same applies to any two inductors included in the filter circuits 40 to 40e.

ADDITIONAL EXEMPLARY ASPECTS

The following aspects are disclosed in the present specification.

A tracker module (100; 100a) according to a first aspect includes a module laminate (9), an IC chip (80), and a filter circuit (40 to 40e). The IC chip (80) is disposed at the module laminate (9). The filter circuit (40 to 40e) includes a plurality of inductors (L1 to L6). The IC chip (80) includes at least one switch (S11 to S44) included in a switched-capacitor circuit (20) and at least one switch (S51 to S54) included in a supply modulator (30). The switched-capacitor circuit (20) is configured to generate a plurality of discrete voltages based on an input voltage. The supply modulator

(30) is configured to selectively output at least one of the plurality of discrete voltages to the filter circuit (40 to 40e). The plurality of inductors (L0 to L6) includes a first inductor (L0 to L6) and a second inductor (L0 to L6) that are disposed at the module laminate (9). The first inductor (L0 to L6) and the second inductor (L0 to L6) are disposed at the module laminate (9). The first inductor (L0 to L6) and the second inductor (L0 to L6) are adjacent to each other. A magnetic flux direction of the first inductor (L0 to L6) and a magnetic flux direction of the second inductor (L0 to L6) are perpendicular to each other.

According to the tracker module (100; 100a) according to the above aspect, the size of the tracker module (100; 100a) can be reduced by causing the first inductor (L0 to L6) and the second inductor (L0 to L6) to be adjacent to each other. Further, according to the tracker module (100; 100a) according to the above aspect, it is possible to reduce the magnetic coupling between the two inductors (L0 to L6) included in the filter circuit (40 to 40e). Thus, it is possible to reduce the change in the frequency of the attenuation pole of the filter circuit (40 to 40e) and to reduce the deterioration in the filter characteristics of the filter circuit (40 to 40e).

In a tracker module (100; 100a) according to a second aspect, in the first aspect, the second inductor (L6) is an inner layer inductor (L6) built (e.g., formed or otherwise disposed) in the module laminate (9).

According to the tracker module (100; 100a) according to the above aspect, when the other inductors (L0 to L5) included in the filter circuit (40 to 40e) are surface-mounted inductors, a design that reduces magnetic coupling between the inner layer inductor (L6) and other inductors (L0 to L5) is facilitated. Thus, the deterioration in the filter characteristics of the filter circuit (40 to 40e) can be easily reduced.

A tracker module (100; 100a) according to a third aspect includes a module laminate (9), an IC chip (80), and a filter circuit (40 to 40e). The IC chip (80) is disposed at the module laminate (9). The filter circuit (40 to 40e) includes a plurality of inductors (L1 to L6). The IC chip (80) includes at least one switch (S11 to S44) included in a switched-capacitor circuit (20) and at least one switch (S51 to S54) included in a supply modulator (30). The switched-capacitor circuit (20) is configured to generate a plurality of discrete voltages based on an input voltage. The supply modulator (30) is configured to selectively output at least one of the plurality of discrete voltages to the filter circuit (40 to 40e). The plurality of inductors (L0 to L6) include a first inductor (L0 to L6) and a second inductor (L0 to L6). The first inductor (L0 to L6) and the second inductor (L0 to L6) are disposed at the module laminate (9). The first inductor (L0 to L6) and the second inductor (L0 to L6) are adjacent to each other. The first inductor (L0 to L6) and the second inductor (L0 to L6) have a rectangular shape in the plan view in a thickness direction (D0) of the module laminate (9). In the plan view in the thickness direction (D0) of the module laminate (9), a longitudinal direction of the first inductor (L0 to L6) and a longitudinal direction of the second inductor (L0 to L6) are perpendicular to each other.

According to the tracker module (100; 100a) according to the above aspect, the size of the tracker module (100; 100a) can be reduced by causing the first inductor (L0 to L6) and the second inductor (L0 to L6) to be adjacent to each other. Further, according to the tracker module (100; 100a) according to the above aspect, it is possible to reduce magnetic coupling between the two inductors (L0 to L6) included in the filter circuit (40 to 40e) by causing magnetic flux directions of the two inductors (L0 to L6) to be perpendicular to each other. Thus, it is possible to reduce the change in the frequency of the attenuation pole of the filter circuit (40 to 40*e*) and to reduce the deterioration in the filter characteristics of the filter circuit (40 to 40*e*).

A tracker module (100; 100*a*) according to a fourth aspect in any one of the first to third aspects further includes an output terminal (164). The output terminal (164) is disposed at the module laminate (9) and is connected to the supply modulator (30) through the filter circuit (40 to 40*e*). The first inductor (L0; L3) has a first end that is connected to the IC chip (80) and a second end that is connected to the output terminal (164). The second inductor (L2; L1) has a third end that is connected to the first end and a fourth end that is connected to a ground.

According to the tracker module (100; 100*a*) according to the above aspect, it is possible to reduce magnetic coupling between the second inductor (L2; L1) and the first inductor (L0; L3) included in an LC series circuit (41 to 44) of the filter circuit (40 to 40*e*). Thus, the change in the frequency of the attenuation pole of the filter circuit (40 to 40*e*) can also be reduced.

A tracker module (100; 100*a*) according to a fifth aspect in any one of the first to third aspects further includes an output terminal (164). The output terminal (164) is disposed at the module laminate (9) and is connected to the supply modulator (30) through the filter circuit (40 to 40*e*). The first inductor (L0; L5) has a first end that is connected to the IC chip (80) and a second end that is connected to the output terminal (164). The second inductor (L1; L6) has a third end that is connected to the second end and a fourth end that is connected to the ground.

According to the tracker module (100; 100*a*) according to the above aspect, it is possible to reduce magnetic coupling between the second inductor (L0; L5) and the first inductor (L1; L6) included in an LC series circuit (41 to 44) of the filter circuit (40 to 40*e*). Thus, the change in the frequency of the attenuation pole of the filter circuit (40 to 40*e*) can also be reduced.

A tracker module (100*a*) according to a sixth aspect in any one of the first to fifth aspects further includes a second supply modulator (30*b*) in the configuration that the supply modulator (30) is set as a first supply modulator (30*a*). The second supply modulator (30*b*) is configured to selectively output at least one of the plurality of discrete voltages to the filter circuit (40*d;* 40*e*). The filter circuit (40*d;* 40*e*) further includes a third inductor (L5 and L6) connected to the second supply modulator (30*b*). The first inductors (L0 to L4) are connected to the first supply modulator (30*a*). The first inductor (L0 to L4) and the third inductor (L5 to L6) are adjacent to each other. The magnetic flux direction of the first inductor (L0 to L4) and the magnetic flux direction of the third inductor (L5 and L6) are perpendicular to each other.

According to the tracker module (100*a*) according to the above aspect, in the filter circuit (40*d;* 40*e*), it is possible to reduce magnetic coupling between the two inductors (L0 to L6) between a path connected to the first supply modulator (30*a*) and a path connected to the second supply modulator (30*b*). Thus, in the filter circuit (40*d;* 40*e*), it is possible to reduce the change in the frequency of the attenuation pole in each of the path connected to the first supply modulator (30*a*) and the path connected to the second supply modulator (30*b*).

In a tracker module (100*a*) according to a seventh aspect, in the sixth aspect, the first inductor (L1, L4) is connected between the first supply modulator (30*a*) and the ground. The third inductor (L6) is connected between the second supply modulator (30*b*) and the ground.

According to the tracker module (100*a*) according to the above aspect, it is possible to reduce an occurrence of a situation in which the circuit constant of each of the LC series circuit (41, 43) in the path connected to the first supply modulator (30*a*) and the LC series circuit (44) in the path connected to the second supply modulator (30*b*) changes due to magnetic coupling between the two inductors (L0 to L6). Thus, in the filter circuit (40*d;* 40*e*), it is possible to reduce the change in the frequency of the attenuation pole in each of the path connected to the first supply modulator (30*a*) and the path connected to the second supply modulator (30*b*).

In a tracker module (100; 100*a*) according to an eighth aspect, in any one of the first to seventh aspects, in the plan view in the thickness direction (D0) of the module laminate (9), each of the first inductor (L0 to L6) and the second inductor (L0 to L6) are adjacent to the IC chip (80).

According to the tracker module (100; 100*a*) according to the above aspect, the wiring between the filter circuit (40 to 40*e*) and the supply modulator (30) can be shortened. Thus, the noise immunity of the tracker module (100; 100*a*) can be improved.

In a tracker module (100; 100*a*) according to a ninth aspect, in the eighth aspect, in the plan view in the thickness direction (D0) of the module laminate (9), at least one of the first inductor (L0 to L6) and the second inductor (L0 to L6) is adjacent to at least one switch (S51 to S54) of the supply modulator (30).

According to the tracker module (100; 100*a*) according to the above aspect, the wiring between the filter circuit (40 to 40*e*) and the supply modulator (30) can be shortened. Thus, the noise immunity of the tracker module (100; 100*a*) can be improved.

In a tracker module (100; 100*a*) according to a tenth aspect, in the eighth aspect, the IC chip (80) further includes at least one of switches (S81 to S84) included in a band select switch circuit (50). The band select switch circuit (50) is connected between the supply modulator (30) and the filter circuit (40 to 40*e*). In the plan view in the thickness direction (D0) of the module laminate (9), at least one of the first inductor (L0 to L6) and the second inductor (L0 to L6) is adjacent to at least one switch (S81 to S84) of the band select switch circuit (50).

According to the tracker module (100; 100*a*) according to the above aspect, the wiring between the filter circuit (40 to 40*e*) and the supply modulator (30) can be shortened. Thus, the noise immunity of the tracker module (100; 100*a*) can be improved.

In a tracker module (100; 100*a*) according to an eleventh aspect, in any one of the first to tenth aspects, the switched-capacitor circuit (20) is connected to a pre-regulator circuit (10). The pre-regulator circuit (10) is configured to convert a DC voltage into an input voltage by using a power inductor (L71). The magnetic flux direction of at least one of the first inductor (L0 to L6) and the second inductor (L0 to L6) is perpendicular to a magnetic flux direction of the power inductor (L71).

According to the tracker module (100; 100*a*) according to the above aspect, the magnetic coupling can be reduced between the inductor (L0 to L6) included in the filter circuit (40 to 40*e*) and the power inductor (L71). Thus, the deterioration in the filter characteristics of the filter circuit (40 to 40*e*) can easily be reduced.

A radio frequency system (200) according to a twelfth aspect includes the tracker module (100; 100*a*) and a power amplifier (2). The power amplifier (2) is connected to the tracker module (100; 100*a*).

According to the radio frequency system (200) according to the above aspect, the size of the tracker module (100; 100a) can be reduced by causing the first inductor (L0 to L6) and the second inductor (L0 to L6) to be adjacent to each other. Further, according to the radio frequency system (200) according to the above aspect, in the tracker module (100; 100a), it is possible to reduce the magnetic coupling between the two inductors (L0 to L6) included in the filter circuit (40 to 40e). Thus, it is possible to reduce the change in the frequency of the attenuation pole of the filter circuit (40 to 40e) and to reduce the deterioration in the filter characteristics of the filter circuit (40 to 40e).

A communication device (7) according to a thirteenth aspect includes the radio frequency system (200) and a signal processing circuit (5) connected to the radio frequency system (200).

According to the communication device (7) according to the above aspect, the size of the tracker module (100; 100a) can be reduced by causing the first inductor (L0 to L6) and the second inductor (L0 to L6) to be adjacent to each other. Further, according to the communication device (7) according to the above aspect, in the tracker module (100; 100a), it is possible to reduce the magnetic coupling between the two inductors (L0 to L6) included in the filter circuit (40 to 40e). Thus, it is possible to reduce the change in the frequency of the attenuation pole of the filter circuit (40 to 40e) and to reduce the deterioration in the filter characteristics of the filter circuit (40 to 40e).

What is claimed:

1. A tracker module comprising:

a module laminate;

a filter circuit including a first inductor, a second inductor and a third inductor that are disposed at the module laminate and adjacent to each other; and an IC chip disposed at the module laminate and including:

at least one switch included in a switched-capacitor circuit that is configured to generate a plurality of discrete voltages based on an input voltage, and at least one switch included in a first supply modulator that is configured to selectively output at least one of the plurality of discrete voltages to the filter circuit; and an output terminal that is disposed at the module laminate and is connected to the first supply modulator through the filter circuit, wherein the first inductor has a first end connected to the IC chip and a second end, wherein the second inductor has a third end connected to the second end of the first inductor and a fourth end connected to a ground, wherein the third inductor has a fifth end connected to the output terminal and a sixth end connected to the second end of the first inductor, wherein the second inductor is disposed between the first inductor and the third inductor in a plan view in a thickness direction of the module laminate, and wherein a magnetic flux direction of the first inductor is perpendicular to a magnetic flux direction of the second inductor.

2. The tracker module according to claim 1, wherein the second inductor is disposed in the module laminate.

3. The tracker module according to claim 1, further comprising:

a second supply modulator configured to selectively output at least one of the plurality of discrete voltages to the filter circuit, wherein:

the first inductor is connected to the first supply modulator, the first inductor and the third inductor are disposed adjacent to each other, and a magnetic flux direction of the first inductor is perpendicular to a magnetic flux direction of the third inductor.

4. The tracker module according to claim 3, wherein:

the first inductor is connected between the first supply modulator and the ground, and the third inductor is connected between the second supply modulator and the ground.

5. The tracker module according to claim 1, wherein each of the first inductor and the second inductor is disposed adjacent to the IC chip in the plan view in the thickness direction of the module laminate.

6. The tracker module according to claim 5, wherein at least one of the first inductor and the second inductor is disposed adjacent to the at least one switch of the first supply modulator in the plan view in the thickness direction of the module laminate.

7. The tracker module according to claim 5, wherein the IC chip further includes:

at least one switch included in a band select switch circuit that is connected between the first supply modulator and the filter circuit, and at least one of the first inductor and the second inductor is disposed adjacent to the at least one switch of the band select switch circuit in a plan view in the thickness direction of the module laminate.

8. The tracker module according to claim 1, wherein:

the switched-capacitor circuit is connected to a pre-regulator circuit that is configured to use a power inductor to convert a DC voltage into the input voltage, and a magnetic flux direction of at least one of the first inductor and the second inductor is perpendicular to a magnetic flux direction of the power inductor.

9. A radio frequency system comprising:

the tracker module according to claim 1; and a power amplifier connected to the tracker module.

10. A communication device comprising:

the radio frequency system according to claim 9; and a signal processing circuit connected to the radio frequency system.

11. A tracker module comprising:

a module laminate;

a filter circuit including a first inductor, a second inductor and a third inductor that are disposed at the module laminate and adjacent to each other; and an IC chip disposed at the module laminate and including:

at least one switch included in a switched-capacitor circuit that is configured to generate a plurality of discrete voltages based on an input voltage, and at least one switch included in a first supply modulator that configured to selectively output at least one of the plurality of discrete voltages to the filter circuit; and an output terminal that is disposed at the module laminate and is connected to the first supply modulator through the filter circuit, wherein the first inductor has a first end connected to the IC chip and a second end, wherein the second inductor has a third end connected to the second end of the first inductor and a fourth end connected to a ground, wherein the third inductor has a fifth end connected to the output terminal and a sixth end connected to the second end of the first inductor, wherein the second inductor is disposed between the first inductor and the third inductor in a plan view in a thickness direction of the module laminate, and wherein, in the plan view in the thickness direction of the module laminate, the first inductor and the second inductor have a rectangular shape, and a longitudinal direction of the first inductor is perpendicular to a longitudinal direction of the second inductor.

12. The tracker module according to claim 11, further comprising:

a second supply modulator configured to selectively output at least one of the plurality of discrete voltages to the filter circuit, wherein:

the first inductor is connected to the first supply modulator, the first inductor and the third inductor are disposed adjacent to each other, and a magnetic flux direction of the first inductor is perpendicular to a magnetic flux direction of the third inductor.

13. The tracker module according to claim 12, wherein:

the first inductor is connected between the first supply modulator and the ground, and the third inductor is connected between the second supply modulator and the ground.

14. The tracker module according to claim 11, wherein each of the first inductor and the second inductor is disposed adjacent to the IC chip in the plan view in the thickness direction of the module laminate.

15. The tracker module according to claim 14, wherein at least one of the first inductor and the second inductor is disposed adjacent to the at least one switch of the first supply modulator in the plan view in the thickness direction of the module laminate.

16. The tracker module according to claim 14, wherein the IC chip further includes:

at least one switch included in a band select switch circuit that is connected between the first supply modulator and the filter circuit, and at least one of the first inductor and the second inductor is disposed adjacent to the at least one switch of the band select switch circuit in a plan view in the thickness direction of the module laminate.

17. The tracker module according to claim 1, wherein an extending direction of respective winding axes of each of the second inductor and the third inductor is in the thickness direction of the module laminate.

18. The tracker module according to claim 11, wherein an extending direction of respective winding axes of each of the second inductor and the third inductor is in the thickness direction of the module laminate.

* * * * *